(12) United States Patent
Hayashi et al.

(10) Patent No.: US 12,269,240 B2
(45) Date of Patent: Apr. 8, 2025

(54) GAS BARRIER FILM

(71) Applicant: TOPPAN INC., Tokyo (JP)

(72) Inventors: Yuki Hayashi, Tokyo (JP); Junpei Hayashi, Tokyo (JP); Kenta Osawa, Tokyo (JP); Takayuki Tani, Tokyo (JP)

(73) Assignee: TOPPAN INC., Tokyo (JP)

( * ) Notice: Subject to any disclaimer, the term of this patent is extended or adjusted under 35 U.S.C. 154(b) by 239 days.

(21) Appl. No.: 17/829,976

(22) Filed: Jun. 1, 2022

(65) Prior Publication Data

US 2022/0288902 A1 Sep. 15, 2022

Related U.S. Application Data

(63) Continuation of application No. PCT/JP2020/045318, filed on Dec. 4, 2020.

(30) Foreign Application Priority Data

| Dec. 6, 2019 | (JP) | 2019-221361 |
| Jan. 10, 2020 | (JP) | 2020-002830 |
| May 12, 2020 | (JP) | 2020-083792 |

(51) Int. Cl.
*B32B 27/08* (2006.01)
*B32B 7/12* (2006.01)
(Continued)

(52) U.S. Cl.
CPC .............. *B32B 27/08* (2013.01); *B32B 7/12* (2013.01); *B32B 27/32* (2013.01); *B65D 65/40* (2013.01);
(Continued)

(58) Field of Classification Search
CPC .......... B32B 2250/242; B32B 2255/10; B32B 2255/205; B32B 2255/26; B32B 2255/28;
(Continued)

(56) References Cited

U.S. PATENT DOCUMENTS

| 2006/0232735 A1* | 10/2006 | Hokazono | H10K 77/111 349/122 |
| 2017/0068040 A1* | 3/2017 | Tyan | G02B 5/0231 |
| 2018/0009206 A1* | 1/2018 | Murase | B32B 9/00 |

FOREIGN PATENT DOCUMENTS

| CN | 107405896 A | 11/2017 |
| EP | 3 275 651 A1 | 1/2018 |

(Continued)

OTHER PUBLICATIONS

Extended European Search Report issued in corresponding European Patent Application No. 20897417.0, dated May 4, 2023.

(Continued)

*Primary Examiner* — Alicia J Weydemeyer
(74) *Attorney, Agent, or Firm* — Foley & Lardner LLP

(57) ABSTRACT

A gas barrier film includes a substrate containing polypropylene as a main component, a gas barrier layer on a first surface of the substrate, and a coating layer on the gas barrier layer. Infrared spectroscopy of the first surface indicates a peak intensity (I1) at 1360 to 1390 cm$^{-1}$ and a peak intensity (I2) at 1440 to 1480 cm$^{-1}$ in a ratio satisfying the formula: (I1)/I(2)≤1.65.

10 Claims, 1 Drawing Sheet

(51) Int. Cl.
  *B32B 27/32* (2006.01)
  *B65D 65/40* (2006.01)
  *B65D 65/42* (2006.01)
  *C23C 14/08* (2006.01)
  *C23C 14/20* (2006.01)
  *C23C 14/30* (2006.01)
(52) U.S. Cl.
  CPC ............ *B65D 65/42* (2013.01); *C23C 14/081* (2013.01); *C23C 14/20* (2013.01); *C23C 14/30* (2013.01); *B32B 2255/10* (2013.01); *B32B 2255/205* (2013.01); *B32B 2255/26* (2013.01); *B32B 2307/518* (2013.01); *B32B 2307/538* (2013.01); *B32B 2307/7244* (2013.01); *B32B 2553/00* (2013.01)
(58) Field of Classification Search
  CPC .......... B32B 2264/00; B32B 2307/518; B32B 2307/536; B32B 2307/538; B32B 2307/7244; B32B 2307/748; B32B 2553/00; B32B 27/08; B32B 27/32; B32B 7/12
  See application file for complete search history.

(56) References Cited

FOREIGN PATENT DOCUMENTS

| | | | |
|---|---|---|---|
| EP | 3 305 682 | A1 | 4/2018 |
| EP | 4 005 795 | A1 | 6/2022 |
| JP | S6049934 | A | 3/1985 |
| JP | H10-264292 | A | 10/1998 |
| JP | H11-099587 | A | 4/1999 |
| JP | 11-254587 | A | 9/1999 |
| JP | 2000-127287 | A | 5/2000 |
| JP | 2000-254994 | A | 9/2000 |
| JP | 2004-050533 | A | 2/2004 |
| JP | 2004-050534 | A | 2/2004 |
| JP | 2004-168040 | A | 6/2004 |
| JP | 2005-335109 | A | 12/2005 |
| JP | 2006-056092 | A | 3/2006 |
| JP | 2008-265855 | A | 11/2008 |
| JP | 2014218090 | A * | 11/2014 |
| JP | 2020-175652 | A | 10/2020 |
| JP | 2021-194822 | A | 12/2021 |
| WO | WO-2017/169952 | A1 | 10/2017 |

OTHER PUBLICATIONS

Nicolas Fedelich: "Application Handbook Thermal Analysis of Polymers Selected Applications Thermal Analysis", Jan. 1, 2013, XP055608279, Retrieved from the Internet: URL:https://www.mt.com/dam/LabDiv/guidesglen/tapolymer/TA_Polymers_Selected_Apps_EN.pdf [retrieved on Jul. 24, 2019].

Submission of Publications issued in corresponding Japanese Patent Application No. 2020-083792 dated Jan. 9, 2024 (42 pages).

Office Action issued in connection with Japanese Appl. No. 2020-83792 dated Jun. 27, 2023.

Office Action issued in connection with Japanese Appl. No. 2020-83792 dated Jul. 20, 2023.

Office Action issued in corresponding Chinese Patent Application No. 202080081430.4 dated Oct. 18, 2023 (19 pages).

International Search Report Issued in International Application No. PCT/JP2020/045318 dated Feb. 16, 2021, 5 pages.

International Searching Authority, "Written Opinion," issued in connection with International Patent Application No. PCT/JP2020/045318, dated Feb. 16, 2021, 4 pages.

* cited by examiner

GAS BARRIER FILM

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/045318, filed on Dec. 4, 2020, which in turn claims the benefit of JP 2019-221361, filed Dec. 6, 2019; JP 2020-083792, filed May 12, 2020; and, JP 2020-002830, filed Jan. 10, 2020, the disclosures of which are incorporated herein by reference in its entirety.

TECHNICAL FIELD

The present invention relates to a gas barrier film and a method of producing the gas barrier film. The gas barrier film according to the present invention is suitable for the packaging of, for example, food, pharmaceuticals, and precision electronic components.

BACKGROUND

Packaging materials used for the packaging of, for example, food, non-food products, and pharmaceuticals may be needed to have gas barrier properties that block the entrance of oxygen, water vapor, and other gases that pass through the packaging materials and deteriorate the contents, in order to prevent the contents from deteriorating and retain the functions and the properties of the contents.

A known packaging material having gas barrier properties is a gas barrier film including a gas barrier layer made from aluminum or other metallic foil, which is unsusceptible to changes in temperature and humidity.

Another known gas barrier film includes, on a substrate film composed of a polymeric material, a vapor deposition film of inorganic oxides such as silicon oxide and aluminum oxide formed by, for example, vacuum evaporation or sputtering (e.g., see Patent Literature 1). These gas barrier films have transparency and barrier properties against gases such as oxygen and water vapor.

Commonly used substrate films are made from polyethylene terephthalate (PET).

[Citation List] [Patent Literature] [PTL 1] JP S60-49934 A.

SUMMARY OF THE INVENTION

Technical Problem

In order to lower the burden on the environment, it has recently become important to recycle plastics used for wrappings and packages. To enable recycling, packaging materials need to be formed from a single material. However, a typical barrier film includes a substrate made from PET and a sealant made from polypropylene (PP) or polyethylene (PE). For this reason, there is a growing demand for a gas barrier film including a substrate film made from PP or PE. Patent Literature 1 also describes that a substrate film made from PP can be used.

However, a gas barrier film simply including a barrier layer formed on a substrate film made from PP or PE does not have sufficient resistance against hot-water treatment such as boiling or retort treatment.

In view of the above circumstances, an object of the present invention is to provide a gas barrier film highly resistant to hot-water treatment and having a reduced environmental burden, and a method of producing the gas barrier film.

Solution to Problem

The present invention includes the following aspects.

[1] A gas barrier film comprising: a substrate containing polypropylene as a main component; a gas barrier layer formed on a first surface of the substrate; and a coating layer formed on the gas barrier layer, wherein infrared spectroscopy of the first surface indicates a peak intensity I1 at 1360 to 1390 cm$^{-1}$ and a peak intensity I2 at 1440 to 1480 cm$^{-1}$ in a ratio satisfying formula (1):

$$I1/I2 \leq 1.65 \quad (1).$$

[2] The gas barrier film according to [1], wherein the substrate includes a surface layer including the first surface and a base layer including a second surface opposite the first surface, and infrared spectroscopy of the second surface indicates a value of formula (1) greater than the value of formula (1) for the first surface.

[3] The gas barrier film according to [1] or [2], wherein the substrate contains fine particles composed of a material other than polypropylene, the fine particles protrude from the first surface, the number of the fine particles is equal to or smaller than 100 per square area with a side length of 260 µm, and the fine particles have a mean height of protrusions of 5 µm or less.

[4] The gas barrier film according to any one of [1] to [3], wherein the first surface has a mean surface roughness Sa of 10 nm or less.

[5] The gas barrier film according to any one of [1] to [4], wherein the gas barrier layer contains, as a main component, any one of aluminum, aluminum oxide, silicon oxide, and silicon oxide containing carbon.

[6] The gas barrier film according to any one of [1] to [5], wherein the coating layer contains at least one alkoxide or a hydrolysate thereof and a water-soluble polymer.

[7] The gas barrier film according to any one of [1] to [6], further comprising a sealant layer heat-sealable to the coating layer, wherein the sealant layer is joined to the coating layer through an adhesive layer.

[8] The gas barrier film according to any one of [1] to [7], wherein the oxygen transmission rate is 3.0 cc/m$^2$·day or less, the water vapor transmission rate is 1.5 g/m$^2$·day or less, and the peel strength according to JIS K 6854-2 and JIS K 6854-3 between the substrate and the gas barrier layer is 1.0 N/15 mm or more.

[9] The gas barrier film according to any one of [1] to [8], wherein after hot-water treatment at 121° C. for 30 minutes, the oxygen transmission rate is 5.0 cc/m$^2$·day or less, the water vapor transmission rate is 2.0 g/m$^2$·day or less, and the peel strength according to JIS K 6854-2 and JIS K 6854-3 between the substrate and the gas barrier layer is 1.0 N/15 mm or more.

[10] The gas barrier film according to any one of [1] to [9], further comprising a pretreated layer interposed between the first surface and the gas barrier layer, wherein the pretreated layer is a layer including any one of a thermoplastic resin, a thermosetting resin, and an ultraviolet curable resin or a layer with the first surface subjected to plasma treatment.

[11] A gas barrier film with a gas barrier layer laminated on at least one surface of a substrate composed of a polymeric material, and a coating layer laminated on the gas barrier layer, wherein the substrate is composed of a block copolymer obtained by block copolymerization of propylene and ethylene, the block copolymer has a melting point of 160° C. or more as measured by differential scanning calorimetry, and after the substrate, the gas barrier layer, and the coating layer are formed, the oxygen transmission rate at 30° C. and 70% RH is 3 cc/m$^2$·day·atm or less, and the water vapor transmission rate at 40° C. and 90% RH is 1 g/m$^2$·day or less.

[12] The gas barrier film according to [11], wherein after hot-water treatment at a temperature of 90° C. or more for 30 minutes or more, the dimensional changes in the machine direction (MD) and the traverse direction (TD) are 2.0% or less.

[13] The gas barrier film according to [11] or [12], wherein the at least one surface of the substrate is provided with any one of a thermoplastic resin layer, a thermosetting resin layer, and an ultraviolet curable resin layer, or a pretreated layer obtained by plasma treatment.

[14] The gas barrier film according to any one of [11] to [13], wherein the number of fine particles protruding from the surface of the substrate is equal to or smaller than 80 per square with 135 μm sides, and the fine particles protruding from the surface of the substrate have a mean height of 5 μm or less.

[15] The gas barrier film according to any one of [11] to [14], wherein the substrate has a mean surface roughness (Sa) of 10 nm or less, and elements have a mean length (RSm) of 600 nm or less.

[16] The gas barrier film according to any one of [11] to [15], wherein the gas barrier layer or the coating layer contains at least one of a metal, an inorganic compound, a metal alkoxide, and a water-soluble polymer.

[17] The gas barrier film according to any one of [11] to [16], wherein the barrier layer contains any one of metallic aluminum, aluminum oxide, and silicon oxide as a main component or a mixture component.

[18] The gas barrier film according to any one of [11] to [17], wherein the coating layer contains either one or both of a metal alkoxide and a water-soluble polymer.

[19] A laminate in which a sealant layer composed of a heat-sealable thermoplastic resin is laminated on the coating layer of the gas barrier film according to any one of [11] to [18].

[20] The laminate according to [19], wherein the sealant layer is laminated over the coating layer with an adhesive interposed therebetween.

[21] The laminate according to [19] or [20], wherein after hot-water treatment at a temperature of 90° C. or more for 30 minutes or more, the peel strength between the substrate and the sealant layer is 1 N/15 mm or more.

[22] A method of producing a gas barrier film, the method comprising: forming a gas barrier layer on at least one surface of a substrate composed of a block copolymer obtained by block copolymerization of propylene and ethylene, and composed of a resin having a melting point of 160° C. or more as measured by differential scanning calorimetry; and forming a coating layer on the gas barrier layer.

Advantageous Effects of the Invention

The present invention can provide a gas barrier film highly resistant to hot-water treatment and having a reduced environmental burden.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

The embodiments of the present invention are a group of embodiments based on a single unique invention. The aspects of the present invention are those of the group of embodiments based on a single invention. Configurations of the present invention can have aspects of the present disclosure. Features of the present invention can be combined to form the configurations. Therefore, the features of the present invention, the configurations of the present invention, the aspects of the present disclosure, and the embodiments of the present invention can be combined, and the combinations can have a synergistic function and exhibit a synergistic effect.

First Embodiment

An embodiment of the present invention will now be described with reference to FIG. 1.

Figure 1:
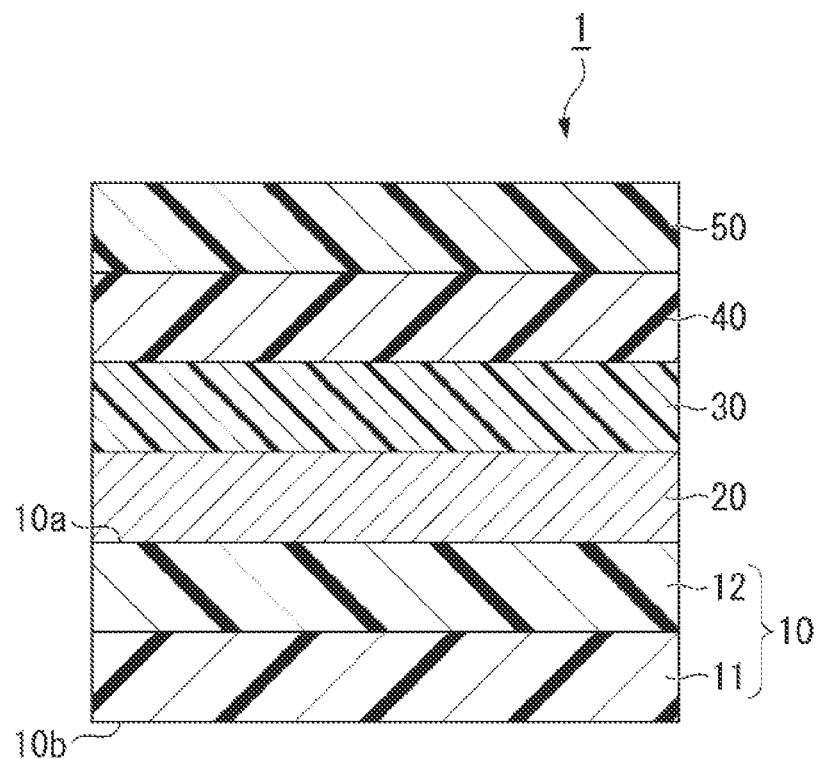
FIG. 1 is a schematic cross-sectional view of a gas barrier film according to an embodiment of the present invention.

FIG. 1 is a schematic cross-sectional view of a gas barrier film 1 according to the present embodiment. The gas barrier film 1 includes a substrate 10, a gas barrier layer 20, a coating layer 30, an adhesive layer 40, and a sealant layer 50.

The substrate 10 includes a resin layer containing polypropylene as a main component. The substrate 10 may include two or more resin layers each containing polypropylene as a main component. The substrate according to the present embodiment includes two resin layers: a base layer 11 and a surface layer 12 laminated on the base layer 11.

The substrate 10 including two or more resin layers can be formed by, for example, coextrusion. The total thickness of the substrate 10, which is the total of the base layer 11 and the surface layer 12, may range, for example, from 3 μm to 200 μm and preferably from 15 μm to 60 μm.

The thickness of the substrate 10 can be measured by the following method. The substrate is measured at its five randomly selected points with a contact film thickness gauge, and the mean value is calculated.

As a raw material for each layer of the substrate 10, a resin containing polypropylene as a main component is used because of its easy availability, water vapor barrier properties, and lighter environmental loads. The polypropylene may be any of a homopolymer, a random copolymer, a block copolymer, and a terpolymer. The homopolymer is polypropylene consisting solely of propylene. The random copolymer is polypropylene in which propylene as a main monomer and a comonomer different from propylene are randomly copolymerized to form a homogeneous phase. The block copolymer is polypropylene in which propylene as a main monomer and the above-mentioned comonomer are copolymerized as a block structure or polymerized as a rubbery structure to form a heterogeneous phase. The terpolymer is polypropylene produced by copolymerization of propylene as a main monomer and two comonomers different from propylene. The terpolymer may be a copolymer of propylene as a main monomer, ethylene, and 1-butene. Any one of these types of polypropylene may be used alone, or a blend of two or more types may be used. The raw materials of the base layer 11 preferably include at least one of a homopolymer, random copolymer, and block copolymer. The raw materials of the surface layer 12 preferably include at least one of the random copolymer, the block copolymer, and the terpolymer. As long as the resin used as a raw material for each layer of the substrate 10 contains polypropylene as a main component, the resin may be, for example, a blend of a resin containing polypropylene and a resin containing a polymer other than polypropylene.

The substrate 10 has a first surface 10a in which the intensity ratio between a peak intensity (I1) at 1370 to 1380 $cm^{-1}$ and a peak intensity (I2) at 1450 to 1460 $cm^{-1}$ in infrared spectroscopy falls within the limit of formula (1). In other words, I1 is 1.65 times I2 or less. In the present embodiment, this intensity ratio is provided by the material properties of the surface layer 12 including the first surface 10a.

$$I1/I2 \leq 1.65 \qquad (1).$$

The value of the above formula (1) indicates the ratio of propylene to the resin components at the measurement position. I1 indicates the quantity of propylene in the resin components at the measurement position. I2 indicates the total quantity of ethylene and propylene in the resin components at the measurement position. Thus, the value of formula (1) for polypropylene that is a homopolymer is greater than for polypropylene that is a copolymer or a terpolymer. For polypropylene that is a copolymer or a terpolymer, the value of formula (1) decreases as the components of ethylene increase in amount.

To form a gas barrier film using a substrate containing polypropylene as a main component, the present inventors have performed various studies. As a result, the inventors have found that as long as the first surface 10a, on which the gas barrier layer 20 is formed, contains polypropylene as a main component, and the value of formula (1) for the first surface 10a is equal to or smaller than 1.65, the gas barrier layer is formed in a good condition without defects, and the cohesive force is great and improves the adhesive strength of the gas barrier layer. The value of formula (1) for the first surface 10a is preferably 1.30 to 1.60, more preferably 1.30 to 1.55, and still more preferably 1.30 to 1.48. For a value equal to or smaller than 1.30, the heat resistance is lower, thus deteriorating the gas barrier properties. For a value equal to or greater than 1.60, the cohesive force is smaller and likely to reduce the adhesive strength.

In one aspect, the gas barrier film 1 according to the present embodiment includes the substrate 10 of a resin containing, as described above, polypropylene as a main component and ethylene, and includes the sealant layer described later of a resin containing propylene and ethylene. The use of these resins maintains a monomaterial structure for reduction in the environmental burden and allows the gas barrier layer having appropriate gas barrier properties to be firmly joined to the substrate and less likely to peel off.

As a result of further studies, the inventors have found that the overall properties of the substrate 10 are further improved by adding the base layer 11 having a higher value of formula (1) to the surface layer 12 including the first surface having the above-described properties. The heat resistance of the entire substrate 10 is improved by laminating a layer having a higher value of formula (1), or in other words, a layer in which propylene is higher in proportion than in the layer including the first surface. As a result, when the coating layer 30 is formed, the substrate 10 can be sufficiently heated, improving the barrier performance of the coating layer 30. Furthermore, when the produced gas barrier film is subjected to hot-water treatment such as retort treatment or boiling treatment, the base layer 11 prevents shrinkage of the surface layer 12, which would cause cracking in the gas barrier layer 20, reduce the gas barrier function, and increase the likelihood that the gas barrier layer 20 would peel from the substrate 10.

For example, the resin used for the surface layer 12 of the substrate 10 is a polypropylene resin blended in a predetermined ratio with, relative to the total mass of a homopolymer of propylene, 0.1 to a few tens of percent by mass polyethylene having a lower melting point such as high density polyethylene (HDPE), low density polyethylene (LDPE), or linear low density polyethylene (LLDPE), a olefin resin such as 1-butene, resin obtained by copolymerizing rubber components such as an elastomer, or polyethylene resin. For the base layer 11, a resin of propylene homopolymer is used. The resin is kneaded with multiple screws and extruded into a film. In this manner, the substrate 10 is produced. Typically, a polypropylene film is lower in heat resistance than a PET film. However, the production method described above provides the base layer 11 that is a propylene homopolymer having high heat resistance and the surface layer 12 that satisfies formula (1), achieving the substrate 10 having excellent heat resistance.

From such a point of view, the value of formula (1) for a second surface 10b included in the base layer 11 is preferably greater than the value for the first surface 10a, more preferably 1.65 or greater, and still more preferably 1.69 to 1.72.

The value of formula (1) can be measured by the following method. A Fourier transform infrared spectrophotometer (e.g., FT/IR-4000, manufactured by JASCO Corporation) is used to measure the first surface or the second surface of the substrate 10 before the production of the gas barrier film under the following measurement conditions.

Measurement condition: ATR method
Prism: Ge
Resolution: 4 $cm^{-1}$
Number of scans: 64

When the gas barrier film produced is subjected to the above-described measurement, the gas barrier film is cut to form a section, and the exposed first surface or second surface can be used for the measurement.

In the substrate 10, the first surface 10a is preferably flat and smooth because the gas barrier layer 20 formed on it is much less likely to develop defects. The mean surface roughness Sa can be used as an index of smoothness, and the value thereof is preferably 10 nm or less, more preferably 7.0 nm or less, and still more preferably 6.0 nm or less. The mean surface roughness Sa is measured at a site without fine particles described later.

The mean surface roughness Sa can be measured by the following method. A scanning probe microscope (e.g., AFM5400L, Hitachi High-Tech Science Corporation) is used to measure the first surface 10a in a randomly selected area of 1 μm square, and calculate the mean surface roughness Sa.

The substrate 10 may contain an additive other than resin components. The additive may be selected as appropriate from various known additives. Examples of the additives include antiblocking agents (AB agents), heat resistant stabilizers, weathering stabilizers, ultraviolet absorbers, lubricants, slipping agents, nucleating agents, antistatic agents, antifogging agents, pigments, and dyes. The AB agents may be organic or inorganic. Any one of these additives may be used alone, or a combination of two or more may be used. Among the above additives, lubricants and slipping agents have advantageous processing suitability. The additive content in the substrate 10 can be adjusted as appropriate without reducing the effects of the present invention.

With the additives held in the form of granules in the substrate 10, their excessive protrusion thereof from the first surface 10a may cause minute defects in the gas barrier layer 20 or the coating layer 30. After examining fine particles composed of a material other than polypropylene and protruding from the first surface, the present inventors have found that a minute defect is less likely to occur when the number of fine particles and the height of the protrusions are equal to or smaller than predetermined values. As examples of the predetermined values for fine particles composed of a material other than polypropylene and protruding from the first surface, the number of fine particles is 100 or smaller per square area with a side length of 260 μm, and the mean height of the protrusions is 5 μm or less. However, the indexes may have any details as long as they are substantially the same as the examples.

When the number of fine particles is greater than 100, and the mean height of the protrusions is greater than 5 μm, the barrier properties deteriorate. Thus, preferably, the number of fine particles is equal to or smaller than 100, and the mean height of the protrusions is 5 μm or less. More preferably, the number of fine particles is equal to or smaller than 80, and the mean height of the protrusions is 4 μm or less. Still more preferably, the number of fine particles is equal to or smaller than 60, and the mean height of the protrusions is 3.5 μm or less. Particularly preferably, the number of fine particles is equal to or smaller than 40, and the mean height of the protrusions is 3 μm or less.

For fine particles composed of a material other than polypropylene and protruding from the first surface, the number of fine particles and the height of the protrusions can be measured by the following method. A laser microscope (e.g., OLS-4000, Olympus Corporation) is used to observe the surface of the first surface 10a and measure the number of fine particles per unit area and the height of the protrusions. The observation magnification is 50 times. The number per unit area is measured within a randomly selected square area with a side length of 260 μm (0.068 mm$^2$) and the two equally sized areas adjacent to the right side of the square area, and the arithmetic mean value in the three areas is determined as the number of fine particles. The height of the protrusions is the arithmetic mean value of all the fine particles counted in the three areas.

The gas barrier layer 20 is formed on the first surface 10a of the substrate 10 included in the surface layer 12. The gas barrier layer 20 contains, as a main component, any one of metallic aluminum, aluminum oxide, silicon oxide, and carbon-containing silicon oxide. For example, "the gas barrier layer contains metallic aluminum as a main component" means that the metallic aluminum accounts for 50% by mass or more of the total mass of the gas barrier layer. The gas barrier layer 20 is a layer having barrier properties against predetermined gases such as oxygen and water vapor.

Appropriate selection of materials in the gas barrier layer 20 allows the gas barrier layer 20 to be transparent or opaque. For example, when the gas barrier layer 20 is made of aluminum oxide, the transparency can be controlled by introducing oxygen gas (regulating the pressure) during film formation.

The thickness of the gas barrier layer 20 can range approximately from 3 nm to 300 nm although the value can be determined as appropriate based on the performance desired for the gas barrier layer while considering the type of an inorganic compound used, the layer structure of the gas barrier layer, and a method for forming the gas barrier layer. A film thickness smaller than 3 nm may be insufficient and result in a non-uniform film, making it difficult to ensure the function of a gas barrier material. A film thickness greater than 300 nm may reduce the flexibility of the film, increasing the likelihood that the gas barrier layer will crack due to external factors such as bending and pulling after the film formation. The thickness of the gas barrier layer 20 may preferably be within the range of 6 to 150 nm.

The thickness of the gas barrier layer herein can be measured in the following manner. The distance between the front surface and the rear surface of the gas barrier layer is measured at five points randomly selected on a cross-section image of the gas barrier layer taken with a scanning electron microscope (also referred to as a SEM) or a transmission electron microscope (also referred to as a TEM). The mean value of the measured distances at the five points is determined as the thickness of the gas barrier layer.

The gas barrier layer 20 may be formed by any method, such as vacuum evaporation, sputtering, ion plating, ion beam deposition, and plasma chemical vapor deposition (CVD). The above-described methods may be combined with a plasma assisted method or an ion beam assisted method to form a denser gas barrier layer, improving the barrier properties and the adhesion.

The coating layer 30 has gas barrier properties mainly against oxygen. The coating layer 30 is formed using a coating agent containing, as a base resin, an aqueous solution or a mixed solution of water and alcohol that contains a water-soluble polymer and at least one metal alkoxide or a hydrolysate thereof. For example, a water-soluble polymer is dissolved in an aqueous solvent (water or a mixed solution of water and alcohol), and the resultant solution is mixed with a metal alkoxide or a hydrolyzed or otherwise pretreated metal alkoxide to prepare a coating agent. The coating agent can be applied onto the gas barrier layer 20 and then dried to form the coating layer 30.

Each component contained in the coating agent for forming the coating layer 30 will now be described in detail.

Examples of water-soluble polymers used for the coating agent include polyvinyl alcohol (also referred to as PVA), polyvinylpyrrolidone, starch, methylcellulose, carboxymethyl cellulose, and sodium alginate. In particular, the use of PVA is preferable because it provides excellent gas barrier properties. A PVA is typically obtained by saponifying polyvinyl acetate. PVA that can be used may be partially saponified PVA in which a few tens of percent of acetic acid group remains or complete PVA in which only few percent of acetic acid group remains. A PVA that is intermediate between them may also be used.

The metal alkoxide used for the coating agent is a compound represented by the general formula: M(OR)n (M: a metal such as Si or Al; R: an alkyl group such as $CH_3$ or $C_2H_5$). Specific examples include tetraethoxysilane [Si$(OC_2H_5)_4$] and aluminum triisopropoxide Al[OCH$(CH_3)_2$]$_3$. Examples of silane coupling agents include an agent having an epoxy group such as 3-glycidoxypropyltrimethoxysilane, an agent having an amino group such as 3-aminopropyltrimethoxysilane, an agent having a mercapto group such as 3-mercaptopropyltrimethoxysilane, an agent having an isocyanate group such as 3-isocyanatopropyltriethoxysilane, and tris(3-trimethoxysilylpropyl) isocyanurate.

The coating agent may be applied by any method selected as appropriate from typically used methods such as dipping, roll coating, screen printing, spraying, and gravure printing, which are conventionally known.

The coating layer 30 may have any thickness determined as appropriate based on the composition of the coating agent and the coating conditions. However, in the case that the coating layer 30 after drying has a film thickness of 0.01 μm or less, the coating may be non-uniform and have insufficient gas barrier properties. In the case that the film thickness after drying is greater than 50 the coating layer 30 is likely to crack. Thus, the thickness of the coating layer 30 may preferably be in the range of, for example, 0.01 μm to 50 μm. The thickness of the coating layer 30 more may preferably be in the range of, for example, 0.1 μm to 10 μm.

The thickness of the coating layer 30 may be measured by the same method as for "the thickness of the gas barrier layer".

The sealant layer 50 is a layer joined by heat-sealing when the gas barrier film 1 is used to form, for example, a pouch package. Examples of a material for the sealant layer 50 include resin materials such as polyethylene, polypropylene, an ethylene-vinyl acetate copolymer, an ethylene-methacrylic acid copolymer, an ethylene-methacrylate copolymer, an ethylene-acrylic acid copolymer, an ethylene-acrylate copolymer, and metal crosslinked products thereof. The gas barrier film 1 according to the present embodiment includes the substrate 10 of a resin containing, as described above, polypropylene as a main component and ethylene, and includes the sealant layer of the resin material described above. The use of these resins maintains a monomaterial structure for reduction in the environmental burden and allows the gas barrier layer having appropriate gas barrier properties to be firmly joined to the substrate and less likely to peel off.

The thickness of the sealant layer 50 may be determined depending on the purpose, but may be in the range of, for example, 15 μm to 200 μm.

The thickness of the sealant layer 50 may be measured by the same method as for "the thickness of the gas barrier layer".

The adhesive layer 40 joins the sealant layer 50 and the coating layer 30. The use of the adhesive layer 40 enables the resin film serving as the sealant layer 50 and the substrate 10, over which the gas barrier layer 20 and the coating layer 30 are formed, to be bonded together by dry lamination. Examples of a material for the adhesive layer 40 include a two-part curing polyurethane adhesive.

Over the coating layer 30, a printed layer, an intervening film, and the sealant layer may be laminated to form a packaging material. When laminating, extrusion lamination may be used to form the sealant layer directly on the coating layer 30 without an adhesive.

The gas barrier film 1 with the above-described configuration preferably has an oxygen transmission rate of 3.0 cc/$m^2$·day or less, and more preferably 2.8 cc/$m^2$·day or less. The gas barrier film 1 also has a water vapor transmission rate of preferably 1.5 g/$m^2$·day or less, and more preferably 1.1 g/$m^2$·day or less. The gas barrier film 1 having these properties is achieved when the value of formula (1) for the first surface 10a of the substrate 10 is equal to or smaller than 1.65, and the value of formula (1) for the second surface is greater than the value of formula (1) for the first surface.

In the gas barrier film 1, the peel strength according to JIS K 6854-2 and JIS K 6854-3 between the substrate 10 and the gas barrier layer 20 is preferably 1.0 N/15 mm or more, more preferably 2.0 N/15 mm or more, and still more preferably 2.5 N/15 mm or more. The gas barrier film 1 having these properties is achieved when the value of formula (1) for the first surface 10a of the substrate 10 is equal to or smaller than 1.65, and the value of formula (1) for the second surface is greater than the value of formula (1) for the first surface.

The gas barrier film 1 after hot-water treatment at 121° C. for 30 minutes preferably has an oxygen transmission rate of 5.0 cc/m % day or less, and more preferably 4.0 cc/$m^2$·day or less. The gas barrier film 1 after the hot-water treatment at 121° C. for 30 minutes preferably has a water vapor transmission rate of 2.0 g/$m^2$·day or less, and more preferably 1.8 g/$m^2$·day or less. The gas barrier film 1 having these properties is achieved when the value of formula (1) for the first surface 10a of the substrate 10 is equal to or smaller than 1.65, and the value of formula (1) for the second surface is greater than the value of formula (1) for the first surface.

In the gas barrier film 1 after the hot-water treatment at 121° C. for 30 minutes, the peel strength according to JIS K 6854-2 and JIS K 6854-3 between the substrate 10 and the gas barrier layer 20 is preferably 1.0 N/15 mm or more, more preferably 2.0 N/15 mm or more, and still more preferably 2.5 N/15 mm or more. The gas barrier film 1 having these properties is achieved when the value of formula (1) for the first surface 10a of the substrate 10 is equal to or smaller than 1.65, and the value of formula (1) for the second surface is greater than the value of formula (1) for the first surface.

The oxygen transmission rates and the water vapor transmission rates of the gas barrier film and the gas barrier film after the hot-water treatment may be measured by the following method. For each gas barrier film, the oxygen transmission rate (OTR) (unit: cc/$m^2$·day·atm, measurement conditions: 30° C., −70% RH) is evaluated with an oxygen transmittance measurement device (e.g., OX-TRAN 2/22 L, manufactured by MOCON Inc.), and the water vapor transmission rate (WVTR) (unit: g/$m^2$·day, measurement conditions: 40° C., −90% RH) is measured by a water vapor permeability measurement device (e.g., PERMATRAN 3/34 G, manufactured by MOCON Inc.). The figures for the gas barrier film after the hot-water treatment are measured by the above method after retort sterilization (at 121° C. for 30 minutes).

A method for producing the gas barrier film 1 with the above-described configuration according to the present embodiment will now be described.

First, the gas barrier layer 20 is formed on the first surface 10a of the substrate 10 by an appropriate method (first step). In the first step, to improve the barrier properties and the adhesion of the first surface 10a before the gas barrier layer is formed, a pretreated layer may be provided between the first surface 10a and the gas barrier layer 20 by forming a coating layer of thermoplastic, thermosetting, ultraviolet curable, or other resin or subjecting the first surface 10a to pretreatment such as corona, plasma, ozone, or flame treatment. The pretreated layer can further enhance the adhesion between the substrate 10 and the gas barrier layer 20.

Among the above-described pretreatments, plasma treatment, which can be performed in an in-line system, has advantageous productivity. Plasma treatment can be performed using a glow discharge, an ion beam, or any other method, and a magnet may also be used to increase the plasma density. The gas used for plasma treatment may be any one or more of oxygen, nitrogen, and argon.

Next, the above-described coating agent is applied onto the gas barrier layer 20 and then dried to form the coating layer 30 on the gas barrier layer (second step).

Additionally, the coating layer 30 is coated with an adhesive serving as the adhesive layer 40, to which a resin film serving as the sealant layer 50 is then bonded (third step) to complete the gas barrier film 1.

Second Embodiment

Another embodiment of the present invention will now be described with reference to FIG. 2.

Figure 2:
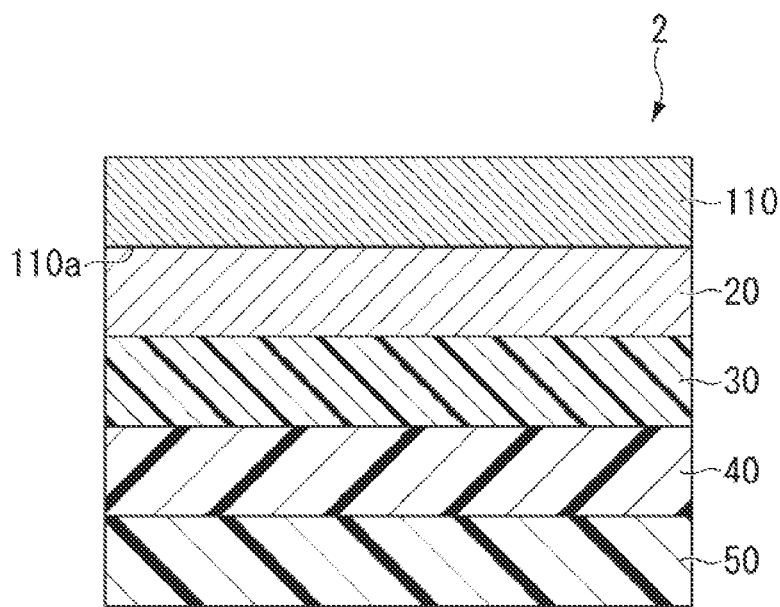
FIG. 2 is a schematic cross-sectional view of a gas barrier film according to an embodiment of the present invention.

FIG. 2 is a schematic cross-sectional view of a gas barrier film 2 according to the present embodiment. The gas barrier film 2 includes a substrate 110, a pretreated layer 110a, a gas barrier layer 20, a coating layer 30, an adhesive layer 40, and a sealant layer 50.

The substrate 110 includes a film composed of a block copolymer obtained by block copolymerization of propylene and ethylene. The substrate 110 may be a stretched film or an unstretched film. For a stretched film, the film may have any stretch ratio. The substrate 110 may have any thickness. For use as a packaging material, the substrate 110 may be a monolayer film or a multilayer film in which films having different properties are layered. In view of the processability in the formation of the gas barrier layer 20 and the coating layer 30, the practical thickness of the substrate 110 preferably may be in the range of 3 to 200 µm, and particularly preferably be in the range of 6 to 30 µm.

Each layer formed over the substrate 110 may be formed at both sides of the substrate 110. One or both sides of the substrate 110 may be covered with a layer including well-known various additives and stabilizers, such as an antistatic agent, an ultraviolet inhibitor, an antioxidant, a plasticizer, and a lubricant.

The above block copolymer may include propylene and ethylene at any ratio. The ratio is selected as appropriate depending on the use, for example, the heat resistance, the low-temperature impact resistance, the transparency, and the heat-sealing properties.

The above block copolymer forming the substrate 110 is a block copolymer having a melting point of 160° C. or more. The melting point and the specific heat of fusion can be measured using a differential scanning calorimeter (DSC measurement). DSC measurement is a method for measuring the temperature difference between a sample and a reference substance as a function of temperature while changing the temperatures of the sample and the reference substance in accordance with a predetermined program. DSC measurement allows determination of the glass transition temperature, the melting point, the crystallization temperature, and the specific heat of fusion of the sample. For a substrate 110 that includes a block copolymer of polypropylene and ethylene having a melting point of 160° C. or more as measured by the differential scanning calorimetry, the gas barrier film has higher resistance to hot-water treatment.

The substrate 110 preferably has little dimensional change after hot-water treatment. After hot-water treatment at a temperature of 90° C. or more for 30 minutes or more, the dimensional changes in the machine direction (MD) and the traverse direction (TD) are each preferably 2% or less, more preferably 1.7% or less, and still more preferably 1.6% or less. When the dimensional changes in the MD and TD exceed 2%, the gas barrier layer 20 may crack causing reduction of the gas barrier properties, or the gas barrier film may have lower adhesion.

The substrate 110 preferably contains fine particles as antiblocking (AB) agent. For the substrate 110 containing fine particles, it is preferable that the number of fine particles protruding from the surface be equal to or smaller than 80 per square area with 135 µm sides, and the protrusions from the surface have a mean height of 5 µm or less. More preferably, the number of AB agent particles is equal to or smaller than 65, and the mean height is 4 µm or less. When the number of AB agent particles is greater than 80, or the mean height is greater than 5 µm, the gas barrier layer 20 may have a defect that reduces the barrier properties, and may fail to have sufficient barrier properties.

The mean surface roughness (Sa) of the substrate 110 is preferably 10 nm or less, and more preferably 7.0 nm or less. The mean length (RSm) of profile curve elements along a sampling length is preferably 600 nm or less, and more preferably 400 nm or less. In the case that the mean surface roughness (Sa) of the substrate surface is greater than 10 nm, the gas barrier layer 20 may have a defect that reduces the barrier properties, and may fail to have sufficient barrier properties.

The mean surface roughness Sa is measured at a site without fine particles. The mean surface roughness Sa can be measured by the above-described method. The mean length (RSm) of the profile curve elements along the sampling length can be measured by the following method. A scanning probe microscope (e.g., AFM5400L, Hitachi High-Tech Science Corporation) is used to measure the first surface 10a at a randomly selected area 1 µm square, and calculate the mean length (RSm) of the profile curve elements along the sampling length.

To improve the barrier properties and the adhesion before the gas barrier layer 20 is formed, the pretreated layer 110a may be provided by forming a coating layer of thermoplastic, thermosetting, ultraviolet curable, or other resin or subjecting the surface of the substrate 110 to corona, plasma, ozone, flame, or other treatment. The pretreated layer 110a may be formed by any method. Plasma treatment, which can be performed in an in-line system, has advantageous productivity. Plasma treatment can be performed using a glow discharge, an ion beam, or any other method, and a magnet may also be used to increase the plasma density. The gas used for plasma treatment may be any one or more of oxygen, nitrogen, and argon.

The gas barrier layer 20 is the gas barrier layer 20 according to the first embodiment. Likewise, the coating layer 30 may be the coating layer 30 according to the first embodiment. The adhesive layer 40 may be the adhesive layer 40 according to the first embodiment. The sealant layer 50 may be the sealant layer 50 according to the first embodiment.

A method for producing the gas barrier film 2 with the above-described configuration according to the present embodiment will now be described.

First, the gas barrier layer 20 is formed on one surface of the substrate 110 (first step). Next, the above-described coating agent is applied onto the gas barrier layer 20 and then dried to form the coating layer 30 on the gas barrier layer 20 (second step). Additionally, the coating layer 30 is coated with an adhesive serving as the adhesive layer 40, to which a resin film serving as the sealant layer 50 is then bonded (third step). These steps are carried out to complete the gas barrier film 2.

The gas barrier film 2 according to the present embodiment, with the above block copolymer used as the substrate 110, has high resistance to hot-water treatment. Specifically, before hot-water treatment, the gas barrier film 2 with an oxygen transmission rate (unit: $cc/m^2 \cdot day \cdot atm$, measurement conditions: 30° C., –70% RH) of 3 $cc/m^2 \cdot day \cdot atm$ or less and a water vapor transmission rate (unit: $g/m^2 \cdot day$, measurement conditions: 40° C., –90% RH) of 1 $g/m^2 \cdot day$ or less has sufficient oxygen barrier properties and water vapor barrier properties. The oxygen transmission rate and the water vapor transmission rate can be measured by the method described in the first embodiment.

In the present embodiment, a gas barrier film in which a sealant layer composed of a heat-sealable thermoplastic resin is laminated on a coating layer is sometimes referred to as a laminate. The laminate may further include an adhesive layer composed of an adhesive, and in this case, the sealant layer is laminated over the coating layer with the adhesive interposed between them.

After the laminate is subjected to hot-water treatment at a temperature of 90° C. or more for 30 minutes or more, the peel strength between the substrate and the sealant layer is preferably 1 N/15 mm or more, and more preferably 2 N/15 mm or more. In the case that the peel strength between the substrate and the sealant layer after the hot-water treatment is 1 N/15 mm or more, the substrate and the sealant layer after the hot-water treatment have good adhesion.

Another aspect of the present invention includes the following aspects.

[23] A gas barrier film comprising: a substrate containing polypropylene as a main component; a gas barrier layer formed on a first surface of the substrate; and a coating layer formed on the gas barrier layer, wherein infrared spectroscopy of the first surface indicates a peak intensity I1 at 1360 to 1390 $cm^{-1}$ and a peak intensity I2 at 1440 to 1480 $cm^{-1}$ in a ratio satisfying formula (1):

$$1.30 \leq I1/I2 \leq 1.48 \tag{1}$$

[24] The gas barrier film according to [23], wherein the substrate includes a surface layer including the first surface and a base layer including a second surface opposite the first surface, and infrared spectroscopy of the second surface indicates a value of formula (1) greater than the value of formula (1) for the first surface.

[25] The gas barrier film according to [23] or [24], wherein the substrate contains fine particles composed of a material other than polypropylene, the fine particles protrude from the first surface, the number of fine particles is equal to or smaller than 40 per square area with a side length of 250 μm, and the fine particles have a mean height of protrusions of 3 μm or less.

[26] The gas barrier film according to any one of [23] to [25], wherein the first surface has a mean surface roughness Sa of 6.0 nm or less.

[27] The gas barrier film according to any one of [23] to [26], wherein the gas barrier layer contains, as a main component, any one of aluminum, aluminum oxide, silicon oxide, and silicon oxide containing carbon.

[28] The gas barrier film according to any one of [23] to [27], wherein the coating layer contains at least one alkoxide or a hydrolysate thereof and a water-soluble polymer.

[29] The gas barrier film according to any one of [23] to [28], further comprising a sealant layer heat-sealable to the coating layer, wherein the sealant layer is joined to the coating layer through an adhesive layer.

[30] The gas barrier film according to any one of [23] to [29], wherein the oxygen transmission rate is 3.0 $cc/m^2 \cdot day$ or less, the water vapor transmission rate is 1.5 $g/m^2 \cdot day$ or less, and the peel strength according to JIS K 6854-2 and JIS K 6854-3 between the substrate and the gas barrier layer is 1.0 N/15 mm or more.

[31] The gas barrier film according to any one of [23] to [30], wherein after hot-water treatment at 121° C. for 30 minutes, the oxygen transmission rate is 5.0 $cc/m^2 \cdot day$ or less, the water vapor transmission rate is 2.0 $g/m^2 \cdot day$ or less, and the peel strength according to JIS K 6854-2 and JIS K 6854-3 between the substrate and the gas barrier layer is 1.0 N/15 mm or more.

[32] The gas barrier film according to any one of [23] to [31], further comprising a pretreated layer interposed between the first surface and the gas barrier layer, wherein the pretreated layer is a layer including any one of a thermoplastic resin, a thermosetting resin, and an ultraviolet curable resin or a layer with the first surface subjected to plasma treatment.

[33] A gas barrier film with a gas barrier layer laminated on at least one surface of a substrate composed of a polymeric material, and a coating layer laminated on the gas barrier layer, wherein the substrate is composed of a block copolymer obtained by block copolymerization of propylene and ethylene, the block copolymer has a melting point of 160° C. or more as measured by differential scanning calorimetry, and after the substrate, the gas barrier layer, and the coating layer are formed, the oxygen transmission rate at 30° C. and 70% RH is 3 $cc/m^2 \cdot day \cdot atm$ or less, and the water vapor transmission rate at 40° C. and 90% RH is 1 $g/m^2 \cdot day$ or less.

[34] The gas barrier film according to [33], wherein after hot-water treatment at a temperature of 90° C. or more for 30 minutes or more, the dimensional changes in the machine direction (MD) and the traverse direction (TD) are 1.7% or less.

[35] The gas barrier film according to [33] or [34], wherein the at least one surface of the substrate is provided with any one of a thermoplastic resin layer, a thermosetting resin layer, and an ultraviolet curable resin layer, or a pretreated layer obtained by plasma treatment.

[36] The gas barrier film according to any one of [33] to [35], wherein the number of fine particles protruding from the surface of the substrate is equal to or smaller than 65 per square with 135 μm sides, and the fine particles protruding from the surface of the substrate have a mean height of 4 μm or less.

[37] The gas barrier film according to any one of [33] to [36], wherein the substrate has a mean surface roughness (Sa) of 7.0 nm or less, and elements have a mean length (RSm) of 400 nm or less.

[38] The gas barrier film according to any one of [33] to [37], wherein the gas barrier layer or the coating layer contains at least one of a metal, an inorganic compound, a metal alkoxide, and a water-soluble polymer.

[39] The gas barrier film according to any one of [33] to [38], wherein the barrier layer contains any one of metallic aluminum, aluminum oxide, and silicon oxide as a main component or a mixture component.

[40] The gas barrier film according to any one of [33] to [39], wherein the coating layer contains either one or both of a metal alkoxide and a water-soluble polymer.

[41] A laminate in which a sealant layer composed of a heat-sealable thermoplastic resin is laminated on the coating layer of the gas barrier film according to any one of [33] to [40].

[42] The laminate according to [41], wherein the sealant layer is laminated over the coating layer with an adhesive interposed therebetween.

[43] The laminate according to [41] or [42], wherein after hot-water treatment at a temperature of 90° C. or more for 30 minutes or more, the peel strength between the substrate and the sealant layer is 2 N/15 mm or more.

[44] A method of producing a gas barrier film, the method comprising: forming a gas barrier layer on at least one surface of a substrate composed of a block copolymer obtained by block copolymerization of propylene and ethylene, and composed of a resin having a melting point of 160° C. or more as measured by differential scanning calorimetry; and forming a coating layer on the gas barrier layer.

The gas barrier film according to the present embodiment will now be further described with reference to examples and comparative examples. The present invention is not limited by the details of the examples and the comparative examples.

Example 1

A biaxially oriented polypropylene film A having a thickness of 20 μm was used as the substrate 10. The polypropylene film A was a coextruded film including two layers: the base layer 11 and the surface layer 12.

A first surface of the polypropylene film A included in the surface layer 12 was subjected to corona treatment. In a vacuum apparatus, with a mixture of silicon and silicon oxide sublimed, electron beam evaporation was used to form the gas barrier layer 20 (30 nm in thickness) composed of silicon oxide.

The gas barrier layer 20 was coated with a coating agent obtained by mixing solutions (1) and (2) below at a mass ratio of 6:4 by gravure coating, and dried to form the coating layer 30 having a thickness of 0.4 μm.

Solution (1): a hydrolyzed solution with a solid content of 3 wt % (in terms of $SiO_2$) obtained by adding 89.6 g of hydrochloric acid (0.1 N) to 10.4 g of tetraethoxysilane, and stirring the resultant mixture for 30 minutes for hydrolysis Solution (2): a water/isopropyl alcohol solution (water and isopropyl alcohol in the weight ratio 90:10) containing 3 wt % polyvinyl alcohol Finally, a two-part curing polyurethane adhesive was used to bond an unstretched polypropylene film (70 μm in thickness) onto the coating layer 30 by dry lamination to obtain a gas barrier film in Example 1.

Example 2

A gas barrier film in Example 2 was produced in the same manner as in Example 1 except that the vapor deposition material was aluminum, and electron beam evaporation was used to form the gas barrier layer 20 composed of metallic aluminum with a thickness of 50 nm.

Example 3

A gas barrier film in Example 3 was produced in the same manner as in Example 1 except that the vapor deposition material was aluminum, and electron beam evaporation with oxygen introduced was used to form the gas barrier layer 20 composed of aluminum oxide with a thickness of 10 nm.

Example 4

A biaxially oriented polypropylene film B having a thickness of 20 μm was used as the substrate 10. The polypropylene film B was a coextruded film including two layers which are the base layer 11 and the surface layer 12, and different from the polypropylene film A.

A gas barrier film in Example 4 was produced in the same manner as in Example 1 except for the above.

Example 5

A gas barrier film in Example 5 was produced in the same manner as in Example 2 except that the polypropylene film B was used as the substrate 10.

Example 6

A gas barrier film in Example 6 was produced in the same manner as in Example 3 except that the polypropylene film B was used as the substrate 10.

Example 7

A biaxially oriented polypropylene film C having a thickness of 20 μm was used as the substrate 10. The polypropylene film C was a coextruded film including two layers which are the base layer 11 and the surface layer 12, and different from each of the polypropylene films A and B.

A gas barrier film in Example 7 was produced in the same manner as in Example 1 except for the above.

Example 8

A gas barrier film in Example 8 was produced in the same manner as in Example 2 except that the polypropylene film C was used as the substrate 10.

Example 9

A gas barrier film in Example 9 was produced in the same manner as in Example 3 except that the polypropylene film C was used as the substrate 10.

Example 10

A biaxially oriented polypropylene film D having a thickness of 20 μm was used as the substrate 10. The polypropylene film D was a coextruded film including two layers which are the base layer 11 and the surface layer 12, and different from each of the polypropylene films A to C.

A gas barrier film in Example 10 was produced in the same manner as in Example 1 except for the above.

Example 11

A gas barrier film in Example 11 was produced in the same manner as in Example 2 except that the polypropylene film D was used as the substrate 10.

Example 12

A gas barrier film in Example 12 was produced in the same manner as in Example 3 except that the polypropylene film D was used as the substrate 10.

Example 13

A biaxially oriented polypropylene film E having a thickness of 20 μm was used as the substrate 10. The polypropylene film E was a coextruded film including two layers which are the base layer 11 and the surface layer 12, and different from each of the polypropylene films A to D.

A gas barrier film in Example 13 was produced in the same manner as in Example 1 except for the above.

Example 14

A gas barrier film in Example 14 was produced in the same manner as in Example 2 except that the polypropylene film E was used as the substrate 10.

Example 15

A gas barrier film in Example 15 was produced in the same manner as in Example 3 except that the polypropylene film E was used as the substrate 10.

Example 16

A gas barrier film in Example 16 was produced in the same manner as in Example 1 except that the polypropylene film A having a thickness of 15 μm was used as the substrate 10.

Example 17

A gas barrier film in Example 17 was produced in the same manner as in Example 2 except that the substrate was the same as in Example 16.

Example 18

A gas barrier film in Example 18 was produced in the same manner as in Example 3 except that the substrate was the same as in Example 16.

Example 19

A gas barrier film in Example 19 was produced in the same manner as in Example 1 except that the polypropylene film A having a thickness of 40 μm was used as the substrate 10.

Example 20

A gas barrier film in Example 20 was produced in the same manner as in Example 2 except that the substrate was the same as in Example 19.

Example 21

A gas barrier film in Example 21 was produced in the same manner as in Example 3 except that the substrate was the same as in Example 19.

Example 22

A biaxially oriented polypropylene film F having a thickness of 20 μm was used as the substrate 10. The polypropylene film F was a coextruded film including two layers which are the base layer 11 and the surface layer 12, and different from each of the polypropylene films A to E.

A gas barrier film in Example 22 was produced in the same manner as in Example 1 except for the above.

Example 23

A biaxially oriented polypropylene film G having a thickness of 20 μm was used as the substrate 10. The polypropylene film G was a coextruded film including two layers which are the base layer 11 and the surface layer 12, and different from each of the polypropylene films A to F.

A gas barrier film in Example 23 was produced in the same manner as in Example 1 except for the above.

Example 24

A biaxially oriented polypropylene film H having a thickness of 20 μm was used as the substrate 10. The polypropylene film H was a coextruded film including two layers which are the base layer 11 and the surface layer 12, and different from each of the polypropylene films A to G.

A gas barrier film in Example 24 was produced in the same manner as in Example 1 except for the above.

Example 25

A biaxially oriented polypropylene film I having a thickness of 20 μm was used as the substrate 10. The polypropylene film I was a coextruded film including two layers which are the base layer 11 and the surface layer 12, and different from each of the polypropylene films A to H.

A gas barrier film in Example 25 was produced in the same manner as in Example 1 except for the above.

Example 26

A gas barrier film in Example 26 was produced in the same manner as in Example 1 except that substrate was subjected to plasma treatment with Ar gas as pretreatment, and silicon oxide was formed subsequently.

Example 27

A gas barrier film in Example 27 was produced in the same manner as in Example 1 except that the substrate was subjected to pretreatment that covered the substrate surface with an acrylic urethane resin layer 50 nm in thickness in which the NCO/OH ratio between an isocyanate curing agent and an acrylic resin containing a hydroxyl group was adjusted to 1.0.

Example 28

A biaxially oriented polypropylene film J having a thickness of 20 μm was used as the substrate 10. The polypropylene film J is a coextruded film including two layers which are the base layer 11 and the surface layer 12, and different from each of the polypropylene films A to I.

A gas barrier film in Example 28 was produced in the same manner as in Example 1 except for the above.

Example 29

A biaxially oriented polypropylene film K having a thickness of 20 μm was used as the substrate 10. The polypropylene film K was a coextruded film including two layers which are the base layer 11 and the surface layer 12, and different from each of the polypropylene films A to J.

A gas barrier film in Example 29 was produced in the same manner as in Example 1 except for the above.

Example 30

A biaxially oriented polypropylene film L having a thickness of 20 μm was used as the substrate 10. The polypropylene film L was a coextruded film including two layers which are the base layer 11 and the surface layer 12, and different from each of the polypropylene films A to K.

A gas barrier film in Example 30 was produced in the same manner as in Example 1 except for the above.

Comparative Example 1

A biaxially oriented polypropylene film M having a thickness of 20 μm was used as the substrate 10. The polypropylene film M was a coextruded film including at least two layers which are the base layer 11 and the surface layer 12, and different from each of the polypropylene films A to L.

A gas barrier film in Comparative Example 1 was produced in the same manner as in Example 1 except for the above.

Comparative Example 2

A gas barrier film in Comparative Example 2 was produced in the same manner as in Example 3 except that the polypropylene film M was used as the substrate 10.

Comparative Example 3

A biaxially oriented polypropylene film N having a thickness of 20 μm was used as the substrate 10. The polypropylene film N was a coextruded film including at least two layers which are the base layer 11 and the surface layer 12, and different from each of the polypropylene films A to M.

A gas barrier film in Comparative Example 3 was produced in the same manner as in Example 1 except for the above.

Comparative Example 4

A gas barrier film in Comparative Example 4 was produced in the same manner as in Example 3 except that the polypropylene film N was used as the substrate 10.

Comparative Example 5

A biaxially oriented polypropylene film O having a thickness of 20 μm was used as the substrate 10. The polypropylene film O was a coextruded film including at least two layers which are the base layer 11 and the surface layer 12, and different from each of the polypropylene films A to N.

A gas barrier film in Comparative Example 5 was produced in the same manner as in Example 1 except for the above.

Comparative Example 6

A gas barrier film in Comparative Example 6 was produced in the same manner as in Example 3 except that the polypropylene film O was used as the substrate 10.

Comparative Example 7

A biaxially oriented polypropylene film P having a thickness of 20 μm was used as the substrate 10. The polypropylene film P was a coextruded film including at least two layers which are the base layer 11 and the surface layer 12, and different from each of the polypropylene films A to O.

A gas barrier film in Comparative Example 7 was produced in the same manner as in Example 1 except for the above.

Comparative Example 8

A gas barrier film in Comparative Example 8 was produced in the same manner as in Example 3 except that the polypropylene film P was used as the substrate 10.

Comparative Example 9

A biaxially oriented polypropylene film Q having a thickness of 20 μm was used as the substrate 10. The polypropylene film Q was a coextruded film including at least two layers which are the base layer 11 and the surface layer 12, and different from each of the polypropylene films A to P.

A gas barrier film in Comparative Example 9 was produced in the same manner as in Example 1 except for the above.

Comparative Example 10

A gas barrier film in Comparative Example 10 was produced in the same manner as in Example 3 except that the polypropylene film Q was used as the substrate 10.

Comparative Example 11

A biaxially oriented polypropylene film R having a thickness of 20 μm was used as the substrate 10. The polypropylene film R was a coextruded film including at least two layers which are the base layer 11 and the surface layer 12, and different from each of the polypropylene films A to Q.

A gas barrier film in Comparative Example 11 was produced in the same manner as in Example 1 except for the above.

Comparative Example 12

A gas barrier film in Comparative Example 12 was produced in the same manner as in Example 3 except that the polypropylene film R was used as the substrate 10.

Comparative Example 13

A biaxially oriented polypropylene film S having a thickness of 20 μm was used as the substrate 10. The polypropylene film S was a coextruded film including at least two layers which are the base layer 11 and the surface layer 12, and different from each of the polypropylene films A to R.
A gas barrier film in Comparative Example 13 was produced in the same manner as in Example 1 except for the above.

Comparative Example 14

A gas barrier film in Comparative Example 14 was produced in the same manner as in Example 3 except that the polypropylene film S was used as the substrate 10.

Comparative Example 15

A biaxially oriented polypropylene film T having a thickness of 20 μm was used as the substrate 10. The polypropylene film T was a coextruded film including at least two layers which are the base layer 11 and the surface layer 12, and different from each of the polypropylene films A to S.
A gas barrier film in Comparative Example 15 was produced in the same manner as in Example 1 except for the above.

Comparative Example 16

A gas barrier film in Comparative Example 16 was produced in the same manner as in Example 3 except that the polypropylene film T was used as the substrate 10.

Comparative Example 17

A biaxially oriented polypropylene film U having a thickness of 20 μm was used as the substrate 10. The polypropylene film U was a coextruded film including at least two layers which are the base layer 11 and the surface layer 12, and different from each of the polypropylene films A to T.
A gas barrier film in Comparative Example 17 was produced in the same manner as in Example 1 except for the above.

Comparative Example 18

A gas barrier film in Comparative Example 18 was produced in the same manner as in Example 3 except that the polypropylene film U was used as the substrate 10.

Comparative Example 19

A gas barrier film in Comparative Example 19 was produced in the same manner as in Example 2 except that the polypropylene film U was used as the substrate 10.
Evaluation categories and measurement methods for the examples and the comparative examples are indicated below.

(Infrared Spectrometry on First Surface and Second Surface)
A Fourier transform infrared spectrophotometer (FT/IR-4000, manufactured by JASCO Corporation) was used to measure each substrate before the production of the gas barrier film on both surfaces facing in the thickness direction. The measurement conditions were as follows:
Measurement condition: ATR method
Prism: Ge
Resolution: 4 cm$^{-1}$
Number of scans: 64
When the gas barrier film produced is subjected to the above-described measurement, the gas barrier film is cut to form a section, and the section can be used for the measurement of the base layer and the surface layer.

(Surface Measurement of First Surface)
Each substrate before production was measured in the manner described below.
Mean surface roughness Sa
A scanning probe microscope (e.g., AFM5400L, Hitachi High-Tech Science Corporation) was used to measure the first surface 10a at a randomly selected area 1 μm square, and calculate the mean surface roughness Sa. The measurement was performed at a site without fine particles.
Number of Fine Particles and Height of Protrusions
A laser microscope (e.g., OLS-4000, Olympus Corporation) was used to observe the surface of the first surface 10a and measure the number of fine particles per unit area and the height of the protrusions. The observation magnification was 50 times. The number per unit area was measured within a randomly selected square with a side length of 260 μm (0.068 mm$^2$) and the two equally sized areas adjacent to the right side of the square, and the arithmetic mean value in the three areas was determined as the number of fine particles. The height of the protrusions was the arithmetic mean value of all the fine particles counted in the three areas.

(Adhesion Evaluation for Gas Barrier Layer Immediately after Production)
A test piece was cut out from the gas barrier film in each example in accordance with JIS K 6854-2 and JIS K 6854-3, and a Tensilon universal testing machine, RTC-1250, manufactured by Orientec Corporation, was used to measure the peel strength of the gas barrier layer 20 as an indicator of adhesion. The measurement was performed using two tests which are a T-peel test and a 180° peel test, under a normal condition (Dry) and a wet measurement site condition (Wet).

(Adhesion Evaluation for Gas Barrier Layer after Hot-Water Treatment)
Two gas barrier films in each example were laminated with the sealant layers 50 facing each other, and bonded together by heat-sealing three sides to produce a pouch (packaging container) in each example. The pouch in each example was filled with water as contents, and then the open side was heat-sealed. Then, retort sterilization was performed as hot-water treatment (at 121° C. for 30 minutes).
After the hot-water treatment, a test piece was cut out in accordance with JIS K 6854-2 and JIS K 6854-3 from a site in contact with the contents of the pouch in each example, and RTC-1250 was used to measure the peel strength of the gas barrier layer 20 as an indicator of adhesion. The measurement was performed using two tests which are a T-peel test and a 180° peel test, under a normal condition (Dry) and a wet measurement site condition (Wet).

(Gas Barrier Performance Evaluation Immediately after Production and after Hot-Water Treatment)
The pouch in each example produced through the above procedure was opened immediately after production and after hot-water treatment. For the gas barrier film, the oxygen transmission rate (OTR) (unit: cc/m²·day·atm, measurement conditions: 30° C., −70% RH) was evaluated with an oxygen transmittance measurement device (OX-TRAN 2/22 L, manufactured by MOCON Inc.), and the water vapor transmission rate (WVTR) (unit: g/m²·day, measurement conditions: 40° C., −90% RH) was evaluated with a water vapor permeability measurement device (PERMATRAN 3/34 G, manufactured by MOCON Inc.).

The structures of Examples 1 to 30 and Comparative Examples 1 to 19 are listed in Tables 1 and 2, respectively, whereas the evaluation results of Examples 1 to 30 and Comparative Examples 1 to 19 are listed in Tables 3 to 5.

TABLE 1

| | Substrate 10 | | | | | | Gas barrier layer 20 | |
| | Formula (1) | | Fine particles | | | | | |
| | | | Count | Mean height | Surface | | | Film |
| | 1st surface | 2nd surface | [particles/ 0.067 mm²] | of protrusions [μm] | Sa [nm] | Pretreatment | Film composition | thickness [nm] |
|---|---|---|---|---|---|---|---|---|
| Ex. 1 | 1.48 | 1.68 | 10 | 2.0 | 5.0 | N/A | SiO$x$ | 30 |
| Ex. 2 | 1.48 | 1.68 | 10 | 2.0 | 5.0 | N/A | Al | 50 |
| Ex. 3 | 1.48 | 1.68 | 10 | 2.0 | 5.0 | N/A | AlO$x$ | 10 |
| Ex. 4 | 1.65 | 1.70 | 10 | 0.8 | 6.5 | N/A | SiO$x$ | 30 |
| Ex. 5 | 1.65 | 1.70 | 10 | 0.8 | 6.5 | N/A | Al | 50 |
| Ex. 6 | 1.65 | 1.70 | 10 | 0.8 | 6.5 | N/A | AlO$x$ | 10 |
| Ex. 7 | 1.47 | 1.71 | 100 | 1.0 | 2.8 | N/A | SiO$x$ | 30 |
| Ex. 8 | 1.47 | 1.71 | 100 | 1.0 | 2.8 | N/A | Al | 50 |
| Ex. 9 | 1.47 | 1.71 | 100 | 1.0 | 2.8 | N/A | AlO$x$ | 10 |
| Ex. 10 | 1.55 | 1.70 | 23 | 5.0 | 4.8 | N/A | SiO$x$ | 30 |
| Ex. 11 | 1.55 | 1.70 | 23 | 5.0 | 4.8 | N/A | Al | 50 |
| Ex. 12 | 1.55 | 1.70 | 23 | 5.0 | 4.8 | N/A | AlO$x$ | 10 |
| Ex. 13 | 1.60 | 1.70 | 15 | 2.0 | 10.0 | N/A | SiO$x$ | 30 |
| Ex. 14 | 1.60 | 1.70 | 15 | 2.0 | 10.0 | N/A | Al | 50 |
| Ex. 15 | 1.60 | 1.70 | 15 | 2.0 | 10.0 | N/A | AlO$x$ | 10 |
| Ex. 16 | 1.48 | 1.68 | 9 | 1.6 | 5.1 | N/A | SiO$x$ | 30 |
| Ex. 17 | 1.48 | 1.68 | 9 | 1.6 | 5.1 | N/A | Al | 50 |
| Ex. 18 | 1.48 | 1.68 | 9 | 1.6 | 5.1 | N/A | AlO$x$ | 10 |
| Ex. 19 | 1.48 | 1.68 | 11 | 1.4 | 5.5 | N/A | SiO$x$ | 30 |
| Ex. 20 | 1.48 | 1.68 | 11 | 1.4 | 5.5 | N/A | Al | 50 |
| Ex. 21 | 1.48 | 1.68 | 11 | 1.4 | 5.5 | N/A | AlO$x$ | 10 |
| Ex. 22 | 1.35 | 1.68 | 10 | 2.0 | 5.0 | N/A | SiO$x$ | 30 |
| Ex. 23 | 1.40 | 1.68 | 10 | 2.0 | 5.0 | N/A | SiO$x$ | 30 |
| Ex. 24 | 1.58 | 1.68 | 10 | 2.0 | 5.0 | N/A | SiO$x$ | 30 |
| Ex. 25 | 1.61 | 1.68 | 10 | 2.0 | 5.0 | N/A | SiO$x$ | 30 |
| Ex. 26 | 1.48 | 1.68 | 10 | 2.0 | 5.0 | Plasma | SiO$x$ | 30 |
| Ex. 27 | 1.48 | 1.68 | 10 | 2.0 | 5.0 | Urethane | SiO$x$ | 10 |
| Ex. 28 | 1.48 | 1.68 | 0 | 0.0 | 5.0 | N/A | SiO$x$ | 30 |
| Ex. 29 | 1.48 | 1.68 | 2 | 0.5 | 5.0 | N/A | SiO$x$ | 30 |
| Ex. 30 | 1.48 | 1.68 | 5 | 0.8 | 5.0 | N/A | SiO$x$ | 30 |

TABLE 2

| | Substrate 10 | | | | | | Gas barrier layer 20 | |
| | Formula (1) | | Fine particles | | | | | |
| | | | Count | Mean height | Surface | | | Film |
| | 1st surface | 2nd surface | [particles/ 0.067 mm²] | of protrusions [μm] | Sa [nm] | Pretreatment | Film composition | thickness [nm] |
|---|---|---|---|---|---|---|---|---|
| Comp. Ex. 1 | 1.48 | 1.47 | 5 | 1.0 | 4.0 | N/A | SiO$x$ | 30 |
| Comp. Ex. 2 | 1.48 | 1.47 | 5 | 1.0 | 4.0 | N/A | AlO$x$ | 10 |
| Comp. Ex. 3 | 1.48 | 1.47 | 5 | 1.0 | 13.0 | N/A | SiO$x$ | 30 |
| Comp. Ex. 4 | 1.48 | 1.47 | 5 | 1.0 | 13.0 | N/A | AlO$x$ | 10 |
| Comp. Ex. 5 | 1.48 | 1.47 | 115 | 2.5 | 6.0 | N/A | SiO$x$ | 30 |
| Comp. Ex. 6 | 1.48 | 1.47 | 115 | 2.5 | 6.0 | N/A | AlO$x$ | 10 |
| Comp. Ex. 7 | 1.48 | 1.47 | 20 | 5.5 | 8.0 | N/A | SiO$x$ | 30 |
| Comp. Ex. 8 | 1.48 | 1.47 | 20 | 5.5 | 8.0 | N/A | AlO$x$ | 10 |
| Comp. Ex. 9 | 1.70 | 1.70 | 20 | 0.6 | 5.0 | N/A | SiO$x$ | 30 |
| Comp. Ex. 10 | 1.70 | 1.70 | 20 | 0.6 | 5.0 | N/A | AlO$x$ | 10 |
| Comp. Ex. 11 | 1.70 | 1.70 | 20 | 0.6 | 15.0 | N/A | SiO$x$ | 30 |
| Comp. Ex. 12 | 1.70 | 1.70 | 20 | 0.6 | 15.0 | N/A | AlO$x$ | 10 |

TABLE 2-continued

| | Substrate 10 | | | | | | Gas barrier layer 20 | |
| --- | --- | --- | --- | --- | --- | --- | --- | --- |
| | Formula (1) | | Fine particles | | | | | Film |
| | 1st surface | 2nd surface | Count [particles/ 0.067 mm$^2$] | Mean height of protrusions [μm] | Surface Sa [nm] | Pretreatment | Film composition | thickness [nm] |
| Comp. Ex. 13 | 1.70 | 1.69 | 120 | 0.7 | 3.5 | N/A | SiO$x$ | 30 |
| Comp. Ex. 14 | 1.70 | 1.69 | 120 | 0.7 | 3.5 | N/A | AlO$x$ | 10 |
| Comp. Ex. 15 | 1.70 | 1.69 | 25 | 5.1 | 7.8 | N/A | SiO$x$ | 30 |
| Comp. Ex. 16 | 1.70 | 1.69 | 25 | 5.1 | 7.8 | N/A | AlO$x$ | 10 |
| Comp. Ex. 17 | 1.69 | 1.47 | 23 | 0.7 | 3.6 | N/A | SiO$x$ | 30 |
| Comp. Ex. 18 | 1.69 | 1.47 | 23 | 0.7 | 3.6 | N/A | AlO$x$ | 10 |
| Comp. Ex. 19 | 1.69 | 1.47 | 23 | 0.7 | 3.6 | N/A | Al | 50 |

TABLE 3

| | Peel strength immediately after production [N/15 mm] | | | | Peel strength after hot-water treatment [N/15 mm] | | | |
| --- | --- | --- | --- | --- | --- | --- | --- | --- |
| | Dry T | Dry 180° | Wet T | Wet 180° | Dry T | Dry 180° | Wet T | Wet 180° |
| Ex. 1 | 3.5 | 4.2 | 3.2 | 4.3 | 3.2 | 4.0 | 3.1 | 4.1 |
| Ex. 2 | 3.3 | 3.6 | 3.1 | 3.5 | 3.1 | 3.5 | 3.0 | 3.5 |
| Ex. 3 | 2.9 | 2.6 | 2.7 | 2.5 | 2.8 | 2.5 | 2.7 | 2.4 |
| Ex. 4 | 3.4 | 2.0 | 3.2 | 1.7 | 3.3 | 1.8 | 3.1 | 1.6 |
| Ex. 5 | 2.9 | 1.9 | 2.9 | 1.8 | 2.8 | 1.8 | 2.9 | 1.7 |
| Ex. 6 | 2.6 | 1.7 | 2.6 | 1.9 | 2.6 | 1.6 | 2.5 | 1.8 |
| Ex. 7 | 3.3 | 4.1 | 3.5 | 4.1 | 3.2 | 4.1 | 3.3 | 4.0 |
| Ex. 8 | 3.2 | 3.5 | 3.2 | 3.6 | 3.0 | 3.5 | 3.1 | 3.6 |
| Ex. 9 | 2.9 | 2.6 | 2.6 | 2.5 | 2.8 | 2.5 | 2.6 | 2.3 |
| Ex. 10 | 3.4 | 4.1 | 3.6 | 3.9 | 3.3 | 4.1 | 3.5 | 3.9 |
| Ex. 11 | 3.3 | 3.6 | 3.1 | 3.6 | 3.2 | 3.5 | 3.0 | 3.6 |
| Ex. 12 | 2.8 | 2.7 | 2.5 | 2.5 | 2.7 | 2.6 | 2.4 | 2.5 |
| Ex. 13 | 3.4 | 3.2 | 3.3 | 4.0 | 3.3 | 3.2 | 3.2 | 4.0 |
| Ex. 14 | 3.2 | 3.5 | 3.2 | 3.6 | 3.0 | 3.4 | 3.1 | 3.6 |
| Ex. 15 | 2.7 | 2.6 | 2.9 | 2.7 | 2.6 | 2.6 | 2.8 | 2.6 |
| Ex. 16 | 3.4 | 3.8 | 3.2 | 3.9 | 3.3 | 3.8 | 3.0 | 3.9 |
| Ex. 17 | 2.8 | 3.3 | 2.6 | 3.2 | 2.6 | 3.2 | 2.6 | 3.1 |
| Ex. 18 | 2.7 | 2.5 | 2.6 | 2.5 | 2.5 | 2.4 | 2.5 | 2.3 |
| Ex. 19 | 3.5 | 4.1 | 3.2 | 4.0 | 3.4 | 4.1 | 3.1 | 4.0 |
| Ex. 20 | 2.7 | 3.3 | 3.1 | 3.5 | 2.6 | 3.3 | 3.0 | 3.5 |
| Ex. 21 | 2.6 | 3.1 | 2.6 | 2.6 | 2.5 | 3.0 | 2.5 | 2.6 |
| Ex. 22 | 3.1 | 4.2 | 3.1 | 3.9 | 3.0 | 4.2 | 2.9 | 3.9 |
| Ex. 23 | 3.2 | 4.1 | 3.2 | 4.0 | 3.1 | 4.1 | 3.1 | 4.0 |
| Ex. 24 | 3.2 | 3.3 | 3.3 | 3.6 | 3.1 | 3.3 | 3.2 | 3.6 |
| Ex. 25 | 3.1 | 3.0 | 3.1 | 3.6 | 3.0 | 3.0 | 3.0 | 3.5 |
| Ex. 26 | 3.5 | 4.2 | 3.3 | 4.2 | 3.4 | 4.2 | 3.2 | 4.2 |
| Ex. 27 | 3.3 | 3.6 | 3.3 | 3.7 | 3.2 | 3.5 | 3.1 | 3.7 |
| Ex. 28 | 3.8 | 4.2 | 3.2 | 3.9 | 3.6 | 4.1 | 3.1 | 4.0 |
| Ex. 29 | 3.8 | 4.3 | 3.1 | 3.9 | 3.7 | 4.1 | 3.2 | 4.0 |
| Ex. 30 | 3.7 | 4.2 | 3.2 | 4.0 | 3.8 | 4.2 | 3.2 | 4.2 |

TABLE 4

| | Barrier properties immediately after production | | Barrier properties after hot-water treatment | |
| --- | --- | --- | --- | --- |
| | OTR [cc/m$^2$ · day · atm] | WVTR [g/m$^2$ · day] | OTR [cc/m$^2$ · day · atm] | WVTR [g/m$^2$ · day] |
| Ex. 1 | 2.1 | 0.7 | 2.8 | 1.2 |
| Ex. 2 | 2.0 | 0.8 | 2.9 | 1.3 |
| Ex. 3 | 2.0 | 0.8 | 3.0 | 1.5 |
| Ex. 4 | 2.3 | 0.4 | 2.5 | 1.0 |
| Ex. 5 | 2.5 | 0.4 | 2.7 | 1.0 |
| Ex. 6 | 2.3 | 0.5 | 2.5 | 1.2 |
| Ex. 7 | 2.8 | 0.8 | 3.5 | 1.5 |
| Ex. 8 | 2.7 | 0.7 | 3.4 | 1.6 |
| Ex. 9 | 2.7 | 0.9 | 3.6 | 1.4 |
| Ex. 10 | 2.5 | 0.6 | 3.0 | 1.2 |
| Ex. 11 | 2.5 | 0.6 | 3.1 | 1.1 |
| Ex. 12 | 2.6 | 0.7 | 3.0 | 1.3 |
| Ex. 13 | 2.3 | 0.9 | 2.6 | 1.5 |
| Ex. 14 | 2.4 | 0.9 | 2.7 | 1.6 |
| Ex. 15 | 2.5 | 0.9 | 3.2 | 1.6 |
| Ex. 16 | 2.5 | 0.6 | 3.3 | 1.5 |
| Ex. 17 | 2.8 | 0.7 | 3.4 | 1.6 |
| Ex. 18 | 2.8 | 0.8 | 3.6 | 1.6 |
| Ex. 19 | 2.1 | 0.6 | 2.5 | 1.1 |
| Ex. 20 | 2.0 | 0.5 | 2.6 | 1.3 |
| Ex. 21 | 2.1 | 0.6 | 2.9 | 1.4 |
| Ex. 22 | 2.2 | 0.9 | 3.2 | 1.6 |
| Ex. 23 | 2.1 | 0.8 | 2.8 | 1.5 |
| Ex. 24 | 2.0 | 0.6 | 2.5 | 1.1 |
| Ex. 25 | 2.1 | 0.5 | 2.4 | 1.0 |
| Ex. 26 | 2.0 | 0.6 | 2.6 | 1.1 |
| Ex. 27 | 1.9 | 0.6 | 2.6 | 1.0 |
| Ex. 28 | 0.1 | 0.3 | 0.6 | 0.6 |
| Ex. 29 | 0.2 | 0.3 | 1.0 | 0.6 |
| Ex. 30 | 0.4 | 0.4 | 1.1 | 0.7 |

TABLE 5

| | Peel strength immediately after production [N/15 mm] | | | | Peel strength after hot-water treatment [N/15 mm] | | | | Barrier properties immediately after production | | Barrier properties after hot-water treatment | |
| --- | --- | --- | --- | --- | --- | --- | --- | --- | --- | --- | --- | --- |
| | Dry T | Dry 180° | Wet T | Wet 180° | Dry T | Dry 180° | Wet T | Wet 180° | OTR [cc/m$^2$ · day · atm] | WVTR [g/m$^2$ · day] | OTR [cc/m$^2$ · day · atm] | WVTR [g/m$^2$ · day] |
| Comp. Ex. 1 | 3.6 | 3.9 | 3.5 | 3.8 | 3.2 | 3.8 | 3.1 | 3.6 | 2.5 | 0.7 | 10.0 | 2.2 |
| Comp. Ex. 2 | 3.3 | 2.9 | 2.9 | 2.9 | 2.8 | 2.5 | 2.7 | 2.6 | 2.8 | 0.9 | 12.0 | 2.5 |
| Comp. Ex. 3 | 3.6 | 3.6 | 3.5 | 3.6 | 3.2 | 3.6 | 3.1 | 3.4 | 3.5 | 1.5 | 13.0 | 3.0 |
| Comp. Ex. 4 | 3.0 | 2.7 | 2.9 | 2.5 | 2.7 | 2.4 | 2.5 | 2.2 | 3.8 | 1.6 | 15.0 | 2.9 |
| Comp. Ex. 5 | 3.5 | 3.6 | 3.5 | 3.5 | 3.1 | 3.4 | 3.2 | 3.3 | 5.2 | 0.8 | 16.0 | 2.3 |
| Comp. Ex. 6 | 2.9 | 2.7 | 2.6 | 2.6 | 2.6 | 2.4 | 2.5 | 2.3 | 6.2 | 0.9 | 17.0 | 2.2 |
| Comp. Ex. 7 | 3.6 | 3.5 | 3.6 | 3.3 | 3.3 | 3.1 | 3.2 | 3.0 | 4.6 | 1.1 | 16.0 | 1.9 |

TABLE 5-continued

|  | Peel strength immediately after production [N/15 mm] | | | | Peel strength after hot-water treatment [N/15 mm] | | | | Barrier properties immediately after production | | Barrier properties after hot-water treatment | |
|---|---|---|---|---|---|---|---|---|---|---|---|---|
|  |  |  |  |  |  |  |  |  | OTR | | OTR | |
|  | Dry T | Dry 180° | Wet T | Wet 180° | Dry T | Dry 180° | Wet T | Wet 180° | [cc/m$^2$ · day · atm] | WVTR [g/m$^2$ · day] | [cc/m$^2$ · day · atm] | WVTR [g/m$^2$ · day] |
| Comp. Ex. 8 | 2.5 | 2.4 | 2.3 | 2.2 | 2.2 | 1.9 | 2.1 | 1.9 | 4.8 | 1.1 | 17.0 | 2.0 |
| Comp. Ex. 9 | 0.8 | 0.6 | 0.5 | 0.6 | 0.6 | 0.4 | 0.5 | 0.4 | 2.6 | 1.0 | 3.5 | 1.5 |
| Comp. Ex. 10 | 0.8 | 0.6 | 0.5 | 0.5 | 0.6 | 0.4 | 0.5 | 0.4 | 2.8 | 1.0 | 3.6 | 1.5 |
| Comp. Ex. 11 | 0.6 | 0.6 | 0.5 | 0.5 | 0.3 | 0.3 | 0.2 | 0.2 | 3.5 | 1.8 | 5.0 | 2.2 |
| Comp. Ex. 12 | 0.6 | 0.7 | 0.5 | 0.6 | 0.3 | 0.3 | 0.2 | 0.2 | 2.9 | 1.7 | 5.1 | 2.3 |
| Comp. Ex. 13 | 0.5 | 0.3 | 0.5 | 0.4 | 0.4 | 0.2 | 0.3 | 0.2 | 8.0 | 0.9 | 11.5 | 1.3 |
| Comp. Ex. 14 | 0.6 | 0.5 | 0.5 | 0.6 | 0.4 | 0.2 | 0.3 | 0.2 | 8.5 | 0.9 | 12.0 | 1.3 |
| Comp. Ex. 15 | 0.6 | 0.5 | 0.5 | 0.6 | 0.5 | 0.2 | 0.4 | 0.2 | 7.7 | 1.0 | 12.6 | 1.2 |
| Comp. Ex. 16 | 0.5 | 0.6 | 0.6 | 0.6 | 0.3 | 0.2 | 0.4 | 0.2 | 7.4 | 1.1 | 12.9 | 1.5 |
| Comp. Ex. 17 | 0.8 | 0.6 | 0.7 | 0.6 | 0.6 | 0.2 | 0.6 | 0.3 | 9.0 | 1.2 | 16.0 | 2.5 |
| Comp. Ex. 18 | 0.9 | 0.6 | 0.7 | 0.8 | 0.6 | 0.2 | 0.6 | 0.3 | 8.5 | 1.3 | 15.5 | 2.6 |
| Comp. Ex. 19 | 0.7 | 0.7 | 0.8 | 0.8 | 0.5 | 0.2 | 0.5 | 0.2 | 7.7 | 1.1 | 16.0 | 2.8 |

The gas barrier film in each example had firm adhesion between the substrate 10 and the gas barrier layer 20 after the hot-water treatment. In addition, the gas barrier film even after the hot-water treatment showed good gas barrier performance with an oxygen transmission rate of 5.0 cc/m$^2$·day or less and a water vapor transmission rate of 2.0 g/m$^2$·day.

In contrast, the gas barrier films in Comparative Examples 9 to 19, in which the value of formula (1) for the first surface was greater than 1.65, had low adhesion between the substrate and the gas barrier layer 20 after the hot-water treatment.

In Comparative Examples 1 to 8, in which the value of formula (1) for each of the first surface and the second surface was smaller than 1.65, both the OTR and the WVTR were lowered after the hot-water treatment. This was considered to be due to damage to the gas barrier layer 20 and the coating layer 30 caused shrinkage of the substrate due to the hot-water treatment.

Example 31

The substrate 110 was a film (20 μm in thickness) composed of a resin obtained by block copolymerization of propylene and ethylene with the substrate surface including the AB agent adjusted to a height of 2.0 μm or less. In a vacuum apparatus, with aluminum evaporated, electron beam evaporation was used to form the gas barrier layer 20 (50 nm in thickness) composed of metallic aluminum.

The gas barrier layer 20 was coated with a coating agent obtained by mixing solutions (1) and (2) below at a weight ratio of 6:4 by gravure coating, and dried to form the coating layer 30 having a thickness of 0.4 μm.

Solution (1): a hydrolyzed solution with a solid content of 3 wt % (in terms of SiO$_2$) obtained by adding 89.6 g of hydrochloric acid (0.1 N) to 10.4 g of tetraethoxysilane, and stirring the resultant mixture for 30 minutes for hydrolysis Solution (2): a water/isopropyl alcohol solution (water and isopropyl alcohol in the weight ratio 90:10) containing 3 wt % polyvinyl alcohol Finally, a two-part curing polyurethane adhesive was used to bond a stretched polypropylene film (70 μm in thickness) serving as the sealant layer 50 onto the coating layer 30 by dry lamination to obtain a gas barrier laminate in Example 31.

Example 32

A gas barrier laminate in Example 32 was produced in the same manner as in Example 31 except that the vapor deposition material was Al, and oxygen was introduced to form the gas barrier layer 20 composed of aluminum oxide with a thickness of 10 nm.

Example 33

A gas barrier laminate in Example 33 was produced in the same manner as in Example 31 except that the vapor deposition material was SiO, and the gas barrier layer 20 composed of silicon oxide was formed with a thickness of 30 nm.

Example 34

A gas barrier film in Example 34 was produced in the same manner as in Example 31 except that the vapor deposition material was HMDSO, and the gas barrier layer 20 composed of silicon oxide formed through plasma and containing carbon was formed with a thickness of 30 nm.

Example 35

A gas barrier laminate in Example 35 was produced in the same manner as in Example 31 except that the vapor deposition materials were SiO and Al, and the gas barrier layer 20 composed of SiAlOx was formed with a thickness of 30 nm.

Example 36

A gas barrier laminate in Example 36 was produced in the same manner as in Example 31 except that the vapor deposition material was SiO, and the gas barrier layer 20 composed of silicon oxynitride formed through plasma and containing nitrogen was formed with a thickness of 30 nm.

Example 37

A gas barrier laminate in Example 37 was produced in the same manner as in Example 31 except that the substrate was subjected to plasma treatment with Ar gas as pretreatment, and aluminum was formed subsequently.

Example 38

A gas barrier laminate in Example 38 was produced in the same manner as in Example 32 except that the substrate was subjected to plasma treatment with Ar gas as pretreatment, and aluminum oxide was formed subsequently.

Example 39

A gas barrier laminate in Example 39 was produced in the same manner as in Example 33 except that the substrate was subjected to plasma treatment with Ar gas as pretreatment, and silicon oxide was formed subsequently.

Example 40

A gas barrier laminate in Example 40 was produced in the same manner as in Example 34 except that the substrate was subjected to plasma treatment with Ar gas as pretreatment, and silicon oxide containing carbon was formed subsequently.

Example 41

A gas barrier laminate in Example 41 was produced in the same manner as in Example 31 except that the substrate was coated with a urethane resin layer as pretreatment.

Example 42

A gas barrier laminate in Example 42 was produced in the same manner as in Example 32 except that the substrate was coated with a urethane resin layer as pretreatment.

Example 43

A gas barrier laminate in Example 43 was produced in the same manner as in Example 33 except that the substrate was coated with a urethane resin layer as pretreatment.

Example 44

A gas barrier laminate in Example 44 was produced in the same manner as in Example 34 except that the substrate was coated with a urethane resin layer as pretreatment.

Example 45

A gas barrier laminate in Example 45 was produced in the same manner as in Example 31 except that the substrate surface included AB agent with a mean height of 4 μm.

Example 46

A gas barrier laminate in Example 46 was produced in the same manner as in Example 32 except that the substrate surface included AB agent with a mean height of 4 μm.

Example 47

A gas barrier laminate in Example 47 was produced in the same manner as in Example 33 except that the substrate surface included AB agent with a mean height of 4 μm.

Example 48

A gas barrier laminate in Example 48 was produced in the same manner as in Example 34 except that the substrate surface included AB agent with a mean height of 4 μm.

Example 49

A gas barrier laminate in Example 49 was produced in the same manner as in Example 37 except that the substrate surface included AB agent with a mean height of 4 μm.

Example 50

A gas barrier laminate in Example 50 was produced in the same manner as in Example 38 except that the substrate surface included AB agent with a mean height of 4 μm.

Example 51

A gas barrier laminate in Example 51 was produced in the same manner as in Example 39 except that the substrate surface included AB agent with a mean height of 4 μm.

Example 52

A gas barrier laminate in Example 52 was produced in the same manner as in Example 40 except that the substrate surface included AB agent with a mean height of 4 μm.

Example 53

A gas barrier laminate in Example 53 was produced in the same manner as in Example 41 except that the substrate surface included AB agent with a mean height of 4 μm.

Example 54

A gas barrier laminate in Example 54 was produced in the same manner as in Example 42 except that the substrate surface included AB agent with a mean height of 4 μm.

Example 55

A gas barrier laminate in Example 55 was produced in the same manner as in Example 43 except that the substrate surface included AB agent with a mean height of 4 μm.

Example 56

A gas barrier laminate in Example 56 was produced in the same manner as in Example 44 except that the substrate surface included AB agent with a mean height of 4 μm.

Comparative Example 20

A gas barrier laminate in Comparative Example 20 was produced in the same manner as in Example 31 except that the substrate was a film composed of a resin obtained by randomly copolymerizing propylene and ethylene.

Comparative Example 21

A gas barrier laminate in Comparative Example 21 was produced in the same manner as in Example 32 except that the substrate was a film composed of a resin obtained by randomly copolymerizing propylene and ethylene.

Comparative Example 22

A gas barrier laminate in Comparative Example 22 was produced in the same manner as in Example 33 except that the substrate was a film composed of a resin obtained by randomly copolymerizing propylene and ethylene.

Comparative Example 23

A gas barrier laminate in Comparative Example 23 was produced in the same manner as in Example 34 except that the substrate was a film composed of a resin obtained by randomly copolymerizing propylene and ethylene.

Comparative Example 24

A gas barrier laminate in Comparative Example 24 was produced in the same manner as in Example 37 except that the substrate was a film composed of a resin obtained by randomly copolymerizing propylene and ethylene and having a melting point of 130° C.

Comparative Example 25

A gas barrier laminate in Comparative Example 25 was produced in the same manner as in Example 38 except that the substrate was a film composed of a resin obtained by randomly copolymerizing propylene and ethylene and having a melting point of 130° C.

Comparative Example 26

A gas barrier laminate in Comparative Example 26 was produced in the same manner as in Example 39 except that the substrate was a film composed of a resin obtained by randomly copolymerizing propylene and ethylene and having a melting point of 130° C.

Comparative Example 27

A gas barrier laminate in Comparative Example 27 was produced in the same manner as in Example 40 except that the substrate was a film composed of a resin obtained by randomly copolymerizing propylene and ethylene and having a melting point of 130° C.

Comparative Example 28

A gas barrier laminate in Comparative Example 28 was produced in the same manner as in Example 41 except that the substrate was a film composed of a resin obtained by randomly copolymerizing propylene and ethylene and having a melting point of 130° C.

Comparative Example 29

A gas barrier laminate in Comparative Example 29 was produced in the same manner as in Example 42 except that the substrate was a film composed of a resin obtained by randomly copolymerizing propylene and ethylene and having a melting point of 130° C.

Comparative Example 30

A gas barrier laminate in Comparative Example 30 was produced in the same manner as in Example 43 except that the substrate was a film composed of a resin obtained by randomly copolymerizing propylene and ethylene and having a melting point of 130° C.

Comparative Example 31

A gas barrier laminate in Comparative Example 31 was produced in the same manner as in Example 44 except that the substrate was a film composed of a resin obtained by randomly copolymerizing propylene and ethylene and having a melting point of 130° C.

Comparative Example 32

A gas barrier laminate in Comparative Example 32 was produced in the same manner as in Example 46 except that the substrate surface included AB agent with a mean height of 6 μm.

Comparative Example 33

A gas barrier laminate in Comparative Example 33 was produced in the same manner as in Example 50 except that the substrate surface included AB agent with a mean height of 6 μm.

Comparative Example 34

A gas barrier laminate in Comparative Example 34 was produced in the same manner as in Example 42 except that the substrate surface included AB agent with a mean height of 6 μm.

Comparative Example 35

A gas barrier laminate in Comparative Example 35 was produced in the same manner as in Example 47 except that the substrate surface included AB agent with a mean height of 6 μm.

Comparative Example 36

A gas barrier laminate in Comparative Example 36 was produced in the same manner as in Example 51 except that the substrate surface included AB agent with a mean height of 6 μm.

Comparative Example 37

A gas barrier laminate in Comparative Example 37 was produced in the same manner as in Example 41 except that the substrate surface included AB agent with a mean height of 6 μm.

(Adhesion Evaluation for Gas Barrier Layer after Hot-Water Treatment)

Two gas barrier laminates in each example were laminated with the sealant layers 50 facing each other, and bonded together by heat-sealing three sides to produce a pouch (packaging container) in each example. The pouch in each example was filled with water as contents, and then the open side was heat-sealed. Then, retort sterilization was performed as hot-water treatment (at 121° C. for 30 minutes).

After the hot-water treatment, a test piece was cut out in accordance with JIS Z1707 from a site in contact with the contents of the pouch in each example, and a Tensilon universal testing machine, RTC-1250, manufactured by Orientec Corporation, was used to measure the peel strength of the sealant layer as an indicator of adhesion. The measurement was performed using two tests which are a T-peel test and a 180° peel test, under a normal condition (Dry) and a wet measurement site condition (Wet).

(Gas Barrier Performance Evaluation after Hot-Water Treatment)

The pouch in each example produced through the above procedure was opened after production and hot-water treatment. For the gas barrier film, the oxygen transmission rate (unit: cc/m²·day·atm, measurement conditions: 30° C., –70% RH) was evaluated with an oxygen transmittance measurement device (OX-TRAN 2/22 L, manufactured by MOCON Inc.), and the water vapor transmission rate (unit: g/m²·day, measurement conditions: 40° C., –90% RH) was evaluated with a water vapor permeability measurement device (PERMATRAN 3/34 G, manufactured by MOCON Inc.).

The evaluation results in Examples 31 to 56 and Comparative Examples 20 to 37 are listed in Tables 6A to 7B.

TABLE 6A

| | Type of Polymerization | Melting point [° C.] | Number of particles of AB agent [Number of particles] | Mean height of AB agent [μm] | Surface roughness Sa [nm] | Surface roughness Rsm [nm] | Pretreated layer | Barrier layer |
|---|---|---|---|---|---|---|---|---|
| Ex. 31 | Block | 165 | 51 | 2.0 | 5.0 | 122 | N/A | Al |
| Ex. 32 | Block | 165 | 45 | 2.0 | 4.7 | 120 | N/A | AlOx |
| Ex. 33 | Block | 165 | 62 | 2.0 | 6.5 | 118 | N/A | SiOx |
| Ex. 34 | Block | 165 | 53 | 2.0 | 5.5 | 110 | N/A | SiOxCy |
| Ex. 35 | Block | 165 | 49 | 2.0 | 5.2 | 119 | N/A | AlSiOx |
| Ex. 36 | Block | 165 | 52 | 2.0 | 6.9 | 113 | N/A | SiONx |
| Ex. 37 | Block | 165 | 45 | 2.0 | 4.9 | 130 | Plasma treated | Al |
| Ex. 38 | Block | 165 | 48 | 2.0 | 4.9 | 126 | Plasma treated | AlOx |
| Ex. 39 | Block | 165 | 55 | 2.0 | 5.9 | 141 | Plasma treated | SiOx |
| Ex. 40 | Block | 165 | 64 | 2.0 | 6.9 | 154 | Plasma treated | SiOxCy |
| Ex. 41 | Block | 165 | 65 | 2.0 | 7.5 | 163 | Thermosetting resin | Al |
| Ex. 42 | Block | 165 | 52 | 2.0 | 5.3 | 147 | Thermosetting resin | AlOx |
| Ex. 43 | Block | 165 | 66 | 2.0 | 5.2 | 119 | Thermosetting resin | SiOx |
| Ex. 44 | Block | 165 | 49 | 2.0 | 6.1 | 113 | Thermosetting resin | SiOxCy |
| Ex. 45 | Block | 165 | 74 | 4.0 | 8.6 | 161 | N/A | Al |
| Ex. 46 | Block | 165 | 45 | 4.0 | 8.6 | 159 | N/A | AlOx |
| Ex. 47 | Block | 165 | 45 | 4.0 | 7.6 | 154 | N/A | SiOx |
| Ex. 48 | Block | 165 | 65 | 4.0 | 5.6 | 143 | N/A | SiOxCy |
| Ex. 49 | Block | 165 | 55 | 4.0 | 6.3 | 110 | Plasma treated | Al |
| Ex. 50 | Block | 165 | 45 | 4.0 | 5.1 | 173 | Plasma treated | AlOx |
| Ex. 51 | Block | 165 | 66 | 4.0 | 4.9 | 149 | Plasma treated | SiOx |
| Ex. 52 | Block | 165 | 47 | 4.0 | 5.8 | 153 | Plasma treated | SiOxCy |

TABLE 6B

| | Type of Polymerization | Melting point [° C.] | Number of particles of AB agent [Number of particles] | Mean height of AB agent [μm] | Surface roughness Sa [nm] | Surface roughness Rsm [nm] | Pretreated layer | Barrier layer |
|---|---|---|---|---|---|---|---|---|
| Ex. 53 | Block | 165 | 65 | 4.0 | 5.7 | 142 | Thermosetting resin | Al |
| Ex. 54 | Block | 165 | 52 | 4.0 | 6.3 | 119 | Thermosetting resin | AlOx |
| Ex. 55 | Block | 165 | 64 | 4.0 | 6.7 | 128 | Thermosetting resin | SiOx |
| Ex. 56 | Block | 165 | 48 | 4.0 | 5.3 | 134 | Thermosetting resin | SiOxCy |
| Comp. Ex. 20 | Random | 130 | 55 | 2.0 | 5.6 | 230 | N/A | Al |
| Comp. Ex. 21 | Random | 130 | 48 | 2.0 | 6.3 | 256 | N/A | AlOx |
| Comp. Ex. 22 | Random | 130 | 47 | 2.0 | 5.4 | 219 | N/A | SiOx |
| Comp. Ex. 23 | Random | 130 | 52 | 2.0 | 5.4 | 251 | N/A | SiOxCy |
| Comp. Ex. 24 | Random | 130 | 88 | 2.0 | 9.6 | 220 | Plasma treated | Al |
| Comp. Ex. 25 | Random | 130 | 91 | 2.0 | 10.3 | 268 | Plasma treated | AlOx |
| Comp. Ex. 26 | Random | 130 | 101 | 2.0 | 12 | 271 | Plasma treated | SiOx |
| Comp. Ex. 27 | Random | 130 | 105 | 2.0 | 11.4 | 268 | Plasma treated | SiOxCy |
| Comp. Ex. 28 | Random | 130 | 95 | 2.0 | 10.1 | 254 | Thermosetting resin | Al |
| Comp. Ex. 29 | Random | 130 | 86 | 2.0 | 9.9 | 238 | Thermosetting resin | AlOx |
| Comp. Ex. 30 | Random | 130 | 121 | 2.0 | 10.8 | 291 | Thermosetting resin | SiOx |
| Comp. Ex. 31 | Random | 130 | 96 | 2.0 | 11.3 | 219 | Thermosetting resin | SiOxCy |
| Comp. Ex. 32 | Block | 165 | 64 | 6.0 | 8.3 | 169 | N/A | AlOx |
| Comp. Ex. 33 | Block | 165 | 89 | 6.0 | 9.8 | 158 | Plasma treated | AlOx |
| Comp. Ex. 34 | Block | 165 | 68 | 6.0 | 6.8 | 147 | Thermosetting resin | AlOx |
| Comp. Ex. 35 | Block | 165 | 63 | 6.0 | 8.3 | 152 | N/A | SiOx |
| Comp. Ex. 36 | Block | 165 | 58 | 6.0 | 7.1 | 138 | Plasma treated | SiOx |
| Comp. Ex. 37 | Block | 165 | 68 | 6.0 | 8.5 | 129 | Thermosetting resin | SiOx |

TABLE 7A

| | Substrate/barrier layer/ coating layer (before sealant is stacked) | | Before hot-water treatment (after sealant is stacked) | | After hot-water treatment (after sealant is stacked) | | Adhesion [N/15 mm] | | Dimensional changes [%] | |
|---|---|---|---|---|---|---|---|---|---|---|
| | | | | | | | Before hot-water treatment | After hot-water treatment | | |
| | OTR | WVTR | OTR | WVTR | OTR | WVTR | | | MD | TD |
| Ex. 31 | 0.9 | 0.9 | 0.4 | 0.4 | 1.2 | 0.8 | 2.4 | 2.5 | 1.1 | 0.5 |
| Ex. 32 | 0.6 | 0.8 | 0.1 | 0.3 | 1.6 | 1.3 | 2.8 | 2.6 | 1.3 | 0.1 |
| Ex. 33 | 0.8 | 0.8 | 0.3 | 0.3 | 1.9 | 1.3 | 2.5 | 3.0 | 2.0 | 0.8 |
| Ex. 34 | 0.6 | 0.5 | 0.1 | 0.1 | 1.2 | 1.1 | 2.8 | 2.5 | 1.2 | 0.2 |
| Ex. 35 | 0.7 | 0.5 | 0.2 | 0.1 | 1.0 | 1.0 | 2.2 | 2.1 | 1.2 | 0.1 |
| Ex. 36 | 0.4 | 0.2 | 0.2 | 0.1 | 0.3 | 0.5 | 2.6 | 2.2 | 1.1 | 0.3 |
| Ex. 37 | 0.6 | 0.7 | 0.1 | 0.2 | 1.9 | 1.4 | 2.5 | 2.4 | 1.5 | 0.5 |
| Ex. 38 | 0.8 | 0.5 | 0.3 | 0.0 | 1.4 | 0.5 | 2.2 | 2.8 | 1.6 | 0.3 |
| Ex. 39 | 0.7 | 0.5 | 0.2 | 0.1 | 1.6 | 1.4 | 2.2 | 2.0 | 2.0 | 0.7 |
| Ex. 40 | 0.4 | 0.5 | 0.1 | 0.1 | 1.8 | 0.6 | 2.7 | 2.1 | 1.6 | 0.1 |
| Ex. 41 | 0.3 | 0.2 | 0.1 | 0.1 | 0.2 | 0.5 | 2.2 | 2.1 | 1.1 | 0.2 |
| Ex. 42 | 0.4 | 0.4 | 0.1 | 0.1 | 1.0 | 1.0 | 2.6 | 2.9 | 1.6 | 0.8 |
| Ex. 43 | 0.4 | 0.3 | 0.1 | 0.1 | 0.3 | 0.8 | 2.5 | 2.1 | 1.0 | 0.2 |
| Ex. 44 | 0.8 | 0.7 | 0.3 | 0.2 | 0.2 | 1.0 | 2.0 | 2.8 | 1.7 | 0.4 |
| Ex. 45 | 1.5 | 1.0 | 1.0 | 0.5 | 1.9 | 1.3 | 2.6 | 2.8 | 1.2 | 0.3 |
| Ex. 46 | 1.4 | 0.7 | 0.9 | 0.2 | 1.9 | 1.4 | 2.7 | 2.0 | 1.0 | 0.5 |
| Ex. 47 | 1.7 | 0.9 | 1.2 | 0.6 | 1.5 | 0.8 | 2.9 | 2.6 | 1.9 | 0.9 |
| Ex. 48 | 1.3 | 0.7 | 0.8 | 0.2 | 1.3 | 0.7 | 2.9 | 2.7 | 1.3 | 0.3 |
| Ex. 49 | 1.7 | 0.9 | 1.2 | 0.4 | 1.3 | 1.2 | 2.1 | 2.7 | 1.5 | 0.6 |
| Ex. 50 | 1.3 | 0.6 | 0.8 | 0.1 | 1.3 | 1.0 | 2.9 | 2.6 | 1.8 | 0.1 |
| Ex. 51 | 1.2 | 0.8 | 0.7 | 0.3 | 2.0 | 0.8 | 2.4 | 2.9 | 1.3 | 0.5 |
| Ex. 52 | 0.6 | 0.7 | 0.1 | 0.2 | 1.3 | 1.2 | 2.4 | 2.8 | 1.1 | 0.3 |

TABLE 7B

| | Substrate/barrier layer/ coating layer (before sealant is stacked) | | Before hot-water treatment (after sealant is stacked) | | After hot-water treatment (after sealant is stacked) | | Adhesion [N/15 mm] | | Dimensional changes [%] | |
|---|---|---|---|---|---|---|---|---|---|---|
| | | | | | | | Before hot-water treatment | After hot-water treatment | | |
| | OTR | WVTR | OTR | WVTR | OTR | WVTR | | | MD | TD |
| Ex. 53 | 1.3 | 0.5 | 0.8 | 0.1 | 0.8 | 1.2 | 2.9 | 2.7 | 1.4 | 0.9 |
| Ex. 54 | 1.5 | 0.7 | 1.0 | 0.2 | 0.7 | 0.8 | 2.0 | 2.3 | 1.6 | 0.0 |
| Ex. 55 | 1.4 | 1.0 | 0.9 | 0.5 | 0.5 | 1.2 | 2.8 | 2.4 | 1.7 | 0.4 |
| Ex. 56 | 1.7 | 1.0 | 1.2 | 0.5 | 0.3 | 0.9 | 2.2 | 2.1 | 1.6 | 0.3 |
| Comp. Ex. 20 | 0.8 | 0.7 | 0.3 | 0.2 | 4.4 | 2.6 | 2.9 | 2.7 | 2.3 | 1.3 |
| Comp. Ex. 21 | 0.6 | 0.7 | 0.1 | 0.2 | 4.5 | 3.5 | 2.2 | 2.3 | 2.9 | 1.7 |
| Comp. Ex. 22 | 0.7 | 0.6 | 0.2 | 0.1 | 4.2 | 3.3 | 2.5 | 2.0 | 2.4 | 1.4 |
| Comp. Ex. 23 | 0.8 | 0.7 | 0.3 | 0.2 | 4.4 | 2.7 | 2.5 | 2.0 | 2.6 | 1.7 |
| Comp. Ex. 24 | 0.5 | 0.8 | 0.1 | 0.3 | 4.6 | 3.1 | 2.4 | 2.0 | 2.2 | 1.6 |
| Comp. Ex. 25 | 0.7 | 0.2 | 0.2 | 0.1 | 3.7 | 3.2 | 2.2 | 2.0 | 2.5 | 1.7 |
| Comp. Ex. 26 | 0.1 | 0.7 | 0.1 | 0.2 | 5.0 | 3.0 | 2.6 | 2.8 | 2.7 | 1.5 |
| Comp. Ex. 27 | 0.8 | 0.7 | 0.3 | 0.2 | 4.6 | 3.1 | 2.4 | 2.6 | 2.8 | 1.7 |
| Comp. Ex. 28 | 0.2 | 0.7 | 0.1 | 0.2 | 4.8 | 2.1 | 2.4 | 2.0 | 2.5 | 1.5 |
| Comp. Ex. 29 | 0.8 | 0.9 | 0.3 | 0.4 | 4.7 | 2.2 | 2.6 | 2.0 | 2.9 | 1.6 |
| Comp. Ex. 30 | 0.1 | 0.6 | 0.1 | 0.1 | 4.3 | 1.5 | 2.5 | 2.1 | 2.7 | 1.6 |
| Comp. Ex. 31 | 0.9 | 0.2 | 0.4 | 0.1 | 4.8 | 1.8 | 2.5 | 2.6 | 2.9 | 1.8 |
| Comp. Ex. 32 | 4.0 | 1.5 | 1.6 | 0.6 | 3.5 | 1.0 | 2.6 | 2.8 | 1.7 | 0.1 |
| Comp. Ex. 33 | 3.2 | 1.9 | 1.9 | 0.7 | 2.7 | 1.4 | 2.6 | 2.9 | 1.1 | 0.4 |
| Comp. Ex. 34 | 3.6 | 1.8 | 1.3 | 1.2 | 3.1 | 1.3 | 2.9 | 2.3 | 1.3 | 0.0 |
| Comp. Ex. 35 | 3.0 | 1.6 | 1.9 | 1.1 | 2.5 | 1.1 | 2.6 | 2.9 | 1.9 | 0.2 |
| Comp. Ex. 36 | 3.3 | 1.8 | 2.0 | 0.8 | 2.8 | 1.3 | 2.1 | 2.7 | 1.6 | 0.7 |
| Comp. Ex. 37 | 3.0 | 1.8 | 1.8 | 1.4 | 2.5 | 1.3 | 2.4 | 2.7 | 1.9 | 0.3 |

For the gas barrier films according to Examples 31 to 56, each of which included the substrate of a block copolymer of propylene and ethylene with a melting point of 160° C. or more, the oxygen transmission rate and the water vapor transmission rate decreased little through the hot-water treatment, resulting in excellent oxygen and water vapor barrier properties after the hot-water treatment. In addition, the gas barrier films according to Examples 31 to 54 experienced little dimensional change through the hot-water treatment, resulting in good adhesion between the substrate and the sealant after the hot-water treatment.

In contrast, the gas barrier films according to Comparative Examples 20 to 31, each of which included the substrate of a random copolymer of propylene and ethylene with a melting point of 130° C., were lower in oxygen and water vapor barrier properties than those in Examples 1 to 24 after the hot-water treatment. In each of the gas barrier films according to Comparative Examples 20 to 31, the dimensional change in the MD through the hot-water treatment exceeded 2%, which was greater than the dimensional changes in Examples 31 to 54. For the gas barrier films according to Comparative Examples 32 to 37, in which fine particles (AB agent) protruding from the substrate surface had a mean height greater than 5 μm, the water vapor transmission rate and/or both the oxygen transmission rate and the water vapor transmission rate before the hot-water treatment were greater than those in Examples 31 to 54.

Although the embodiments and the examples of the present invention have been described, the specific details are not limited to the embodiments. The present invention also includes structural modifications or combinations that fall within the spirit and scope of the invention.

The gas barrier film according to the present invention may also include a printed layer provided at an appropriate position. Additionally, an intervening film may be applied to the coating layer to provide the gas barrier film with desired physical properties such as pinhole resistance, cold resistance, heat resistance, drop resistance, and tear resistance.

Furthermore, an adhesive layer or a sealant layer is not essential in the gas barrier film of the present invention. In other words, the adhesive layer or the sealant layer may be provided as needed based on the specific use of the gas barrier film.

INDUSTRIAL APPLICABILITY

The gas barrier film according to the present invention is suitable for the packaging of, for example, food, pharmaceuticals, and precision electronic components.

The present invention can provide a gas barrier film highly resistant to hot-water treatment and having a reduced environmental burden.

[Reference Signs List] 1, 2 Gas barrier film; 10, 110 Substrate; 10a First surface; 10b Second surface; 11 Base layer; 12 Surface layer; 20 Gas barrier layer; 30 Coating layer; 40 Adhesive layer; 50 Sealant layer; 110a Pretreated layer.

What is claimed is:

1. A gas barrier film, comprising:
   a substrate comprising polypropylene as a main component, the substrate consists of a surface layer and a base layer, the surface layer includes a first surface of the substrate, the base layer includes a second surface of the substrate opposite to the first surface of the substrate;
   a gas barrier layer on the first surface of the substrate; and
   a coating layer on the gas barrier layer, wherein
   when the first surface is subjected to infrared spectroscopy, the infrared spectroscopy indicates a peak intensity I1 at 1360 to 1390 cm$^{-1}$ and a peak intensity I2 at 1440 to 1480 cm$^{-1}$ in a ratio satisfying formula (1):

$$I1/I2 \leq 1.65 \qquad (1),$$

when the second surface is subjected to infrared spectroscopy, the infrared spectroscopy indicates a value of the I1/I2 ratio for the second surface greater than the value of the I1/I2 ratio for the first surface,
   wherein a value of I1 indicates a quantity of propylene and a value of I2 indicates a total quantity of ethylene and propylene.

2. The gas barrier film of claim 1, wherein
   the substrate contains fine particles composed of a material other than polypropylene,
   the fine particles protrude from the first surface,
   the fine particles comprise 100 or less fine particles per square area with a side length of 260 μm, and
   the fine particles have a mean height of protrusions of 5 μm or less.

3. The gas barrier film of claim 1, wherein
   the first surface has a mean surface roughness Sa of 10 nm or less.

4. The gas barrier film of claim 1, wherein
   the gas barrier layer contains, as a main component, any one of aluminum, aluminum oxide, silicon oxide, and silicon oxide containing carbon.

5. The gas barrier film of claim 1, wherein
   the coating layer contains at least one alkoxide or a hydrolysate thereof and a water-soluble polymer.

6. The gas barrier film of claim 1, further comprising:
   a sealant layer heat-sealable to the coating layer,
   wherein the sealant layer is joined to the coating layer through an adhesive layer.

7. The gas barrier film of claim 1, wherein
   the gas barrier film has an oxygen transmission rate of 3.0 cc/m$^2$·day or less and a water vapor transmission rate of 1.5 g/m$^2$·day or less, and
   the substrate and the gas barrier layer have a peel strength therebetween according to JIS K 6854-2 and JIS K 6854-3, the peel strength being 1.0 N/15 mm or more.

8. The gas barrier film of claim 1, wherein
   after hot-water treatment at 121° C. for 30 minutes, the oxygen transmission rate is 5.0 cc/m$^2$·day or less, the water vapor transmission rate is 2.0 g/m$^2$·day or less, and
   the peel strength according to JIS K 6854-2 and JIS K 6854-3 between the substrate and the gas barrier layer is 1.0 N/15 mm or more.

9. The gas barrier film of claim 1, further comprising:
   a pretreated layer interposed between the first surface and the gas barrier layer,
   wherein the pretreated layer is a layer including any one of a thermoplastic resin, a thermosetting resin, and an ultraviolet curable resin or a layer with the first surface subjected to plasma treatment.

10. The gas barrier film of claim 1, wherein the value of formula (1) for the first surface is 1.30 to 1.60, and the value of formula (1) for the second surface is 1.69 to 1.72.

* * * * *